United States Patent
Watanabe

(10) Patent No.: US 12,107,091 B2
(45) Date of Patent: Oct. 1, 2024

(54) DISPLAY DEVICE AND DISPLAY SYSTEM

(71) Applicant: Japan Display Inc., Tokyo (JP)

(72) Inventor: Yoshihiro Watanabe, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/949,582

(22) Filed: Sep. 21, 2022

(65) Prior Publication Data

US 2023/0014991 A1 Jan. 19, 2023

Related U.S. Application Data

(63) Continuation of application No. PCT/JP2021/012852, filed on Mar. 26, 2021.

(30) Foreign Application Priority Data

Mar. 31, 2020 (JP) ................................ 2020-063769
Dec. 10, 2020 (JP) ................................ 2020-205274

(51) Int. Cl.
*H01L 27/12* (2006.01)
*G02F 1/1343* (2006.01)
(Continued)

(52) U.S. Cl.
CPC ...... *H01L 27/124* (2013.01); *G02F 1/134336* (2013.01); *G02F 1/134363* (2013.01); *G02F 1/136286* (2013.01); *G09G 3/2096* (2013.01); *G09G 2300/0842* (2013.01); *G09G 2360/16* (2013.01)

(58) Field of Classification Search
CPC ............. H01L 27/124; G02F 1/134336; G02F 1/134363; G02F 1/136286; G09G 3/2096; G09G 2300/0842; G09G 2360/16
See application file for complete search history.

(56) References Cited

U.S. PATENT DOCUMENTS

| 5,694,188 A | 12/1997 | Sano et al. |
| 5,847,684 A * | 12/1998 | Strik .................... G02F 1/1365 |
| | | 345/55 |

(Continued)

FOREIGN PATENT DOCUMENTS

| JP | H02-135425 A | 5/1990 |
| JP | H08-313923 A | 11/1996 |

(Continued)

OTHER PUBLICATIONS

International Search Report issued in International Patent Application No. PCT/JP2021/012852 on May 25, 2021 and English translation of same. 7 pages.

(Continued)

*Primary Examiner* — Amare Mengistu
*Assistant Examiner* — Jennifer L Zubajlo
(74) *Attorney, Agent, or Firm* — K&L Gates LLP

(57) ABSTRACT

A display device having a display region to be viewed through a lens, the display device comprising: a substrate; and the display region in which the substrate is provided with a plurality of pixels, a plurality of scan lines extending in a first direction, and a plurality of signal lines extending in a second direction, wherein the first direction is non-parallel and non-orthogonal to a direction orthogonal to the second direction.

20 Claims, 28 Drawing Sheets

(51) Int. Cl.
  *G02F 1/1362* (2006.01)
  *G09G 3/20* (2006.01)

(56) References Cited

U.S. PATENT DOCUMENTS

| | | | | |
|---|---|---|---|---|
| 6,768,482 B2 * | 7/2004 | Asano | ............... | G09G 3/3233 345/100 |
| 7,123,277 B2 * | 10/2006 | Brown Elliott | .......... | G09G 5/02 382/167 |
| 9,287,338 B2 * | 3/2016 | So | ............... | H10K 59/122 |
| 10,074,301 B2 * | 9/2018 | Chen | ............... | H10K 59/353 |
| 2005/0088385 A1 * | 4/2005 | Elliott | ............... | G06T 3/4007 345/87 |
| 2005/0184952 A1 * | 8/2005 | Konno | ............... | G09G 3/3648 345/102 |
| 2006/0146211 A1 * | 7/2006 | Deane | ............... | G09G 3/2085 349/42 |
| 2008/0018557 A1 * | 1/2008 | Maeda | ............... | G02F 1/167 345/55 |
| 2010/0013853 A1 * | 1/2010 | Takatori | ............... | H05B 47/16 345/611 |
| 2010/0177123 A1 * | 7/2010 | Fredlund | ............... | G09G 3/02 345/690 |
| 2015/0234189 A1 | 8/2015 | Lyons | | |
| 2015/0234192 A1 | 8/2015 | Lyons | | |
| 2015/0234193 A1 | 8/2015 | Lyons | | |
| 2015/0234501 A1 | 8/2015 | Lyons | | |
| 2015/0235426 A1 | 8/2015 | Lyons | | |
| 2016/0253006 A1 | 9/2016 | Lyons | | |
| 2016/0277722 A1 * | 9/2016 | Guo | ............... | H04N 13/31 |
| 2016/0334628 A1 | 11/2016 | Lyons | | |
| 2017/0110087 A1 * | 4/2017 | Chen | ............... | G09G 3/2003 |
| 2017/0255019 A1 | 9/2017 | Lyons | | |
| 2017/0276982 A1 * | 9/2017 | Nakanishi | ............... | G02F 1/1333 |
| 2019/0162955 A1 * | 5/2019 | Jang | ............... | G02B 5/201 |
| 2019/0212561 A1 * | 7/2019 | Shin | ............... | G06T 19/006 |
| 2019/0265488 A1 | 8/2019 | Lyons | | |
| 2020/0005710 A1 * | 1/2020 | Miyata | ............... | G09G 3/3233 |
| 2021/0091151 A1 * | 3/2021 | Lee | ............... | H10K 59/122 |

FOREIGN PATENT DOCUMENTS

| | | |
|---|---|---|
| JP | H10-078590 A | 3/1998 |
| JP | H10-170924 A | 6/1998 |
| JP | 2005-529368 A | 9/2005 |
| JP | 2007-264258 A | 10/2007 |
| JP | 2008-287285 A | 11/2008 |
| JP | 2010-256912 A | 11/2010 |
| JP | 2014-067045 A | 4/2014 |
| JP | 2017-511041 A | 4/2017 |
| JP | 2019-120929 A | 7/2019 |
| JP | 2020-004708 A | 1/2020 |
| WO | WO2016/039184 A1 | 3/2016 |

OTHER PUBLICATIONS

Written Opinion issued in International Patent Application No. PCT/JP2021/012852 on May 25, 2021. 11 pages.

Office Action issued in related Japanese Patent Application No. 2020-205274 on Apr. 2, 2024 and English translation of same. 24 pages.

Office Action issued in related Chinese Patent Application No. 202180025491.3 on Jan. 30, 2024 and English translation of same. 36 pages.

* cited by examiner

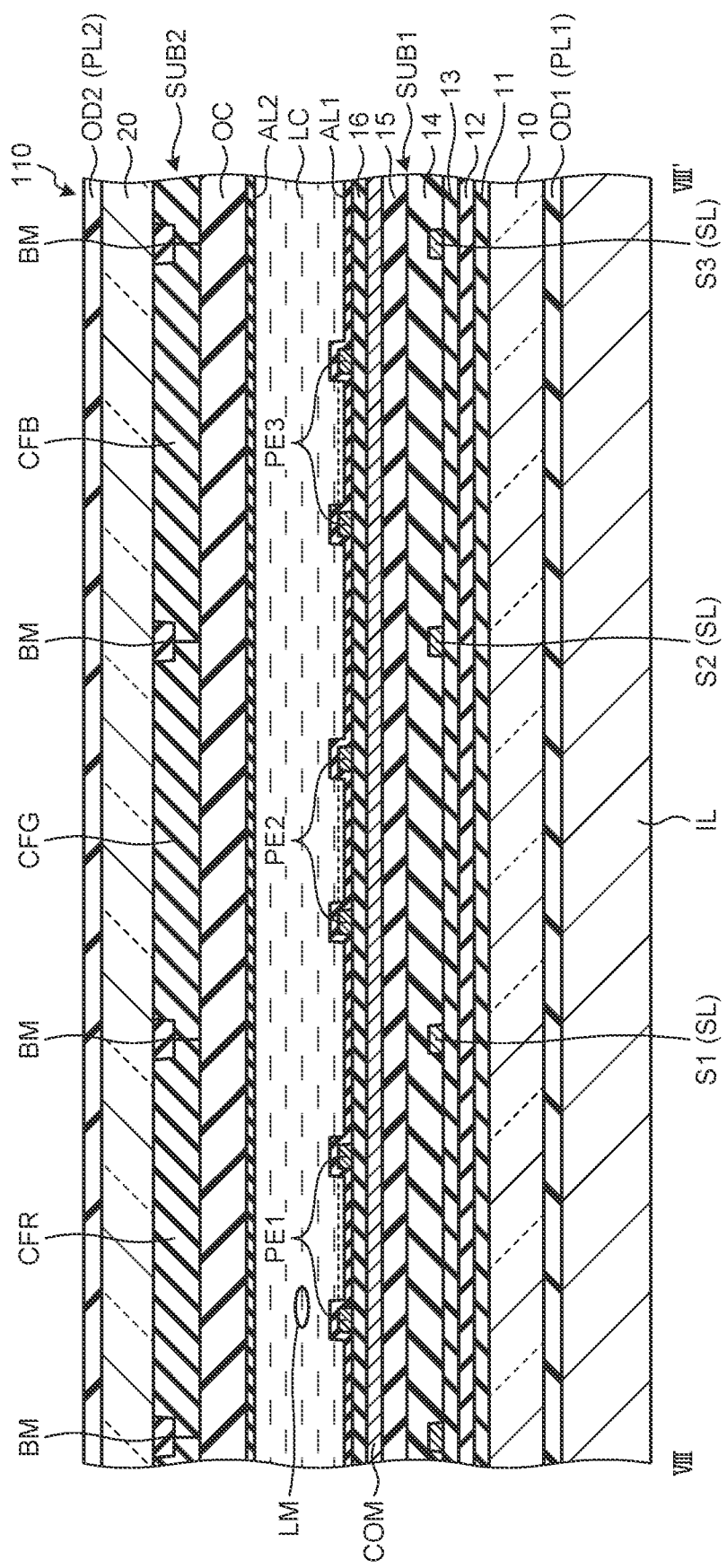

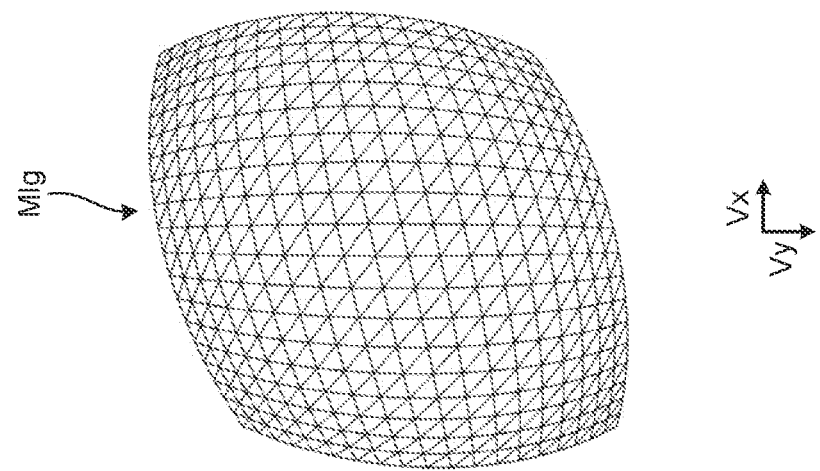
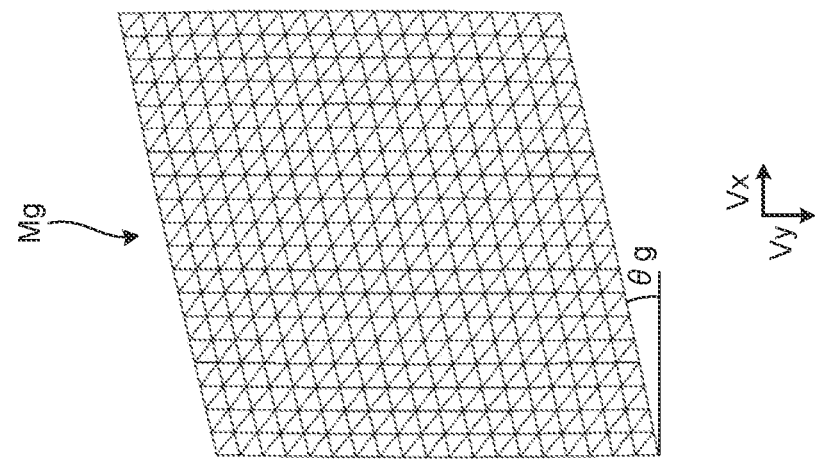
FIG.9B
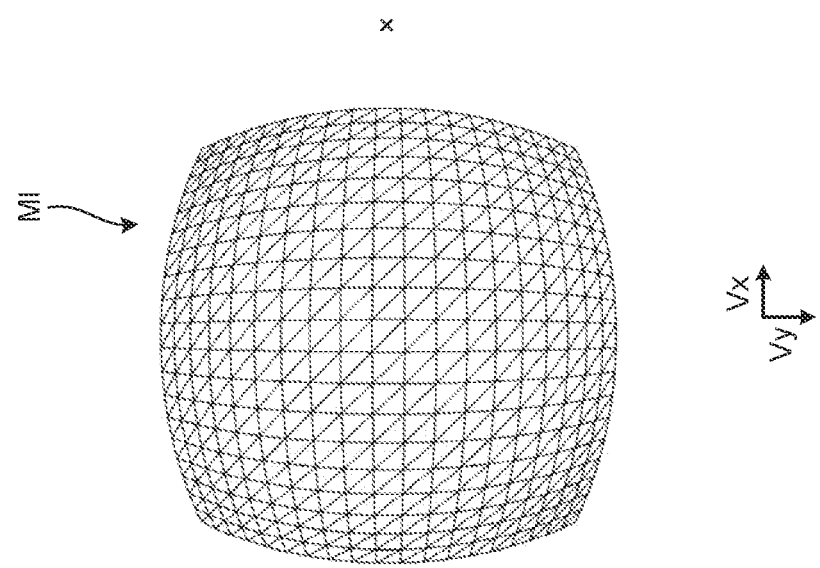

DISPLAY DEVICE AND DISPLAY SYSTEM

CROSS-REFERENCE TO RELATED APPLICATION

This application is a continuation of International Patent Application No. PCT/JP2021/012852 filed on Mar. 26, 2021 which designates the United States, incorporated herein by reference, and which claims the benefit of priority from Japanese Patent Application No. 2020-063769 filed on Mar. 31, 2020 and Japanese Patent Application No. 2020-205274 filed on Dec. 10, 2020, incorporated herein by reference.

BACKGROUND

1. Technical Field

The present disclosure relates to a display device and a display system.

2. Description of the Related Art

A virtual reality (VR) system stereoscopically displays a three-dimensional object, and gives a user a sense of virtual reality by changing the display of the stereoscopic image as a point of view moves. For example, Japanese Translation of PCT International Application Publication No. 2017-511041 discloses a display system that allows an image to be visible on a display device through two lenses.

Pixels of display devices of Japanese Patent Application Laid-open Publication No. H8-313923, Japanese Patent Application Laid-open Publication No. H10-170924, and Japanese Patent Application Laid-open Publication No. H10-078590 are known.

However, since the pixels of the display device are viewed through the lenses, the visibility may be reduced.

SUMMARY

A display device according to an embodiment having a display region to be viewed through a lens is disclosed. The display device includes a substrate, and the display region in which the substrate is provided with a plurality of pixels, a plurality of scan lines extending in a first direction, and a plurality of signal lines extending in a second direction. The first direction is non-parallel and non-orthogonal to a direction orthogonal to the second direction.

BRIEF DESCRIPTION OF THE DRAWINGS

FIG. 8 is a sectional view schematically illustrating a section along VIII-VIII' in FIG. 7;

FIG. 9B is a diagram illustrating an example of compensation processing to compensate for distortion of the image displayed by the display system according to the first embodiment;

DETAILED DESCRIPTION

Figure 1:
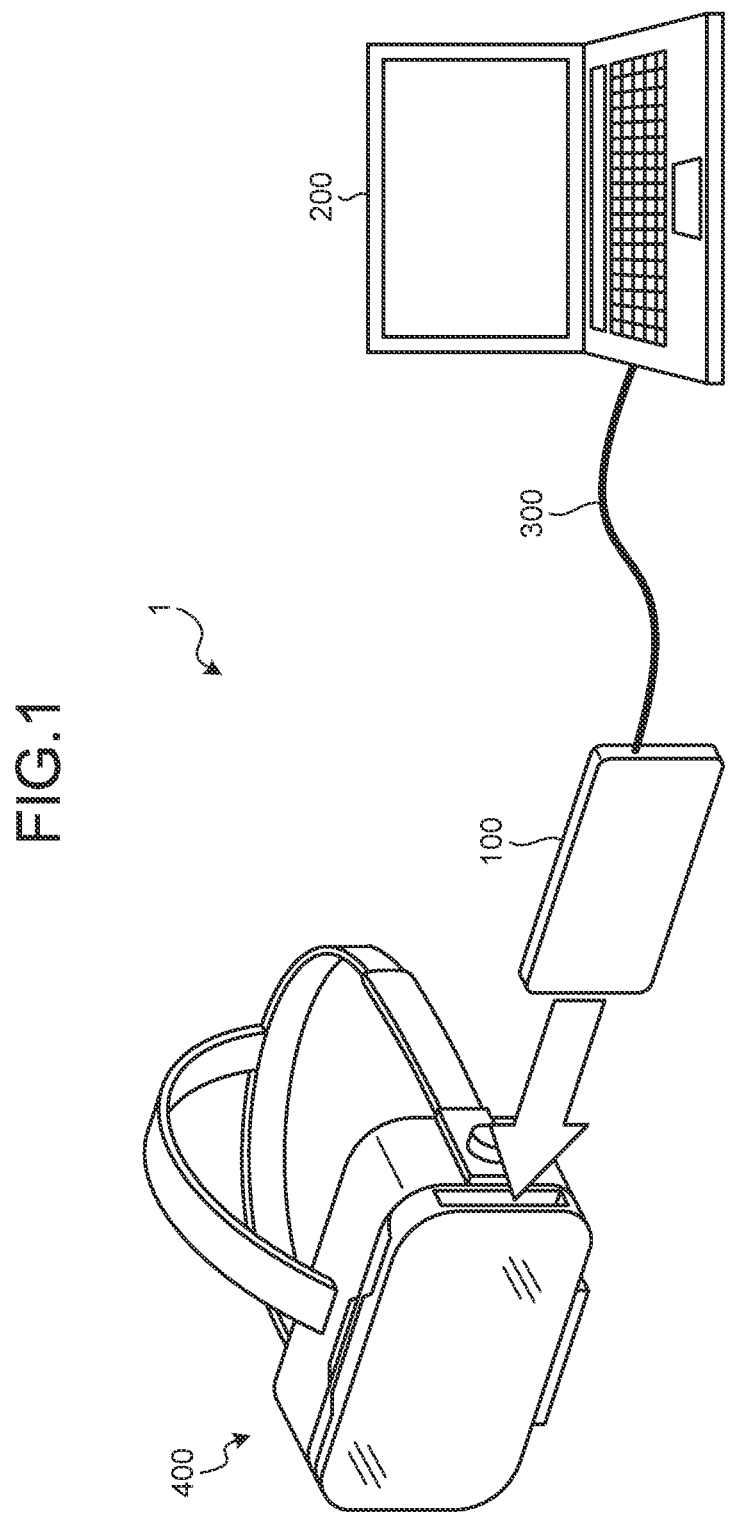
FIG. 1 is a configuration diagram illustrating an exemplary display system according to a first embodiment.

The following describes modes (embodiments) for carrying out the present invention in detail with reference to the drawings. The present disclosure is not limited to the description of the embodiments to be given below. Components to be described below include those easily conceivable by those skilled in the art or those substantially identical thereto. In addition, the components to be described below can be combined as appropriate. What is disclosed herein is merely an example, and the present disclosure naturally encompasses appropriate modifications easily conceivable by those skilled in the art while maintaining the gist of the invention. To further clarify the description, the drawings may schematically illustrate, for example, widths, thicknesses, and shapes of various parts as compared with actual aspects thereof. However, they are merely examples, and interpretation of the present disclosure is not limited thereto. The same component as that described with reference to an already mentioned drawing is denoted by the same reference numeral through the description and the drawings, and detailed description thereof may not be repeated where appropriate.

First Embodiment

Figure 2:
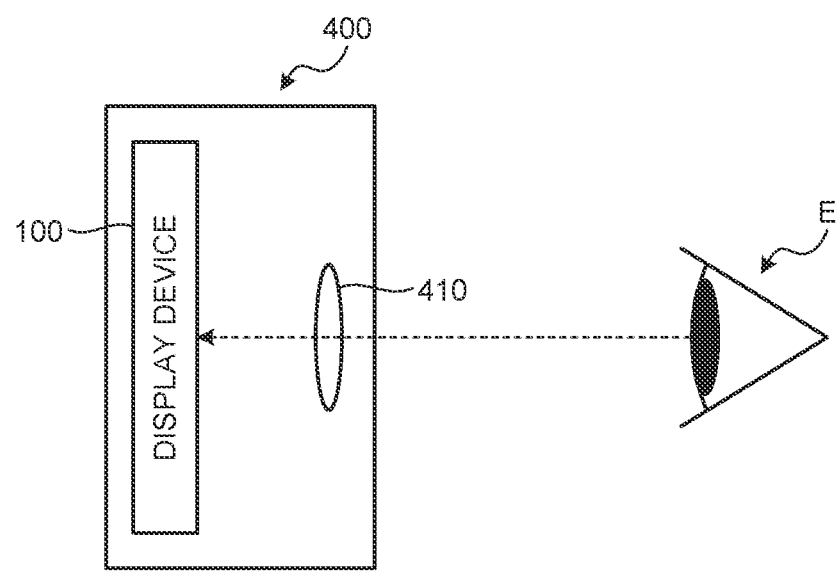
FIG. 2 is a schematic diagram illustrating an exemplary relative relation between a display device and an eye of a user.

FIG. 1 is a configuration diagram illustrating an exemplary display system according to a first embodiment. FIG. 2 is a schematic diagram illustrating an exemplary relative relation between a display device and an eye of a user.

In the present embodiment, a display system 1 is a display system that changes display as a user moves. The display system 1 is, for example, a virtual reality (VR) system that stereoscopically displays a virtual reality image representing, for example, a three-dimensional object in a virtual space, and changes the stereoscopic display according to a direction (position) of the head of the user so as to cause the user to experience a sense of virtual reality.

The display system 1 includes, for example, a display device 100 and a control device 200. The display device 100 and the control device 200 are configured to be capable of receiving and outputting information (signals) through a cable 300. Examples of the cable 300 include a Universal Serial Bus (USB) cable and a High-Definition Multimedia Interface (HDMI) (registered trademark) cable. The display device 100 and the control device 200 may be configured to be capable of receiving and outputting the information through wireless communication.

The display device 100 is supplied with power from the control device 200 through the cable 300. For example, the display device 100 may include a power receiver supplied with the power from a power supply of the control device 200 through the cable 300, and use the power supplied from the control device 200 to drive components, for example, display panels 110 and a sensor 120 of the display device 100. This configuration can eliminate, for example, a battery from the display device 100, and can provide the display device 100 having a smaller weight at a lower cost. The battery may be provided in a wearable member 400 or the display device 100, and supply the power to the display device.

The display device 100 includes the display panels. Each of the display panels is, for example, a liquid crystal display, but may be, for example, an organic electroluminescent (EL) panel, a micro-organic light-emitting diode (μ-OLED) panel, a micro-light-emitting diode (μ-LED) panel, or a mini-LED panel.

The display device 100 is fixed to the wearable member 400. Examples of the wearable member 400 include a headset, goggles, and a helmet with a mask that covers the eyes of the user. The wearable member 400 is worn on the head of the user. When being worn, the wearable member 400 is disposed in front of the user so as to cover the eyes of the user. The wearable member 400 positions the internally fixed display device 100 in front of the eyes of the user so as to serve as an immersive wearable member. The wearable member 400 may include an output unit for outputting, for example, a sound signal output from the control device 200. The wearable member 400 may have a structure incorporating functions of the control device 200.

While the example illustrated in FIG. 1 illustrates a case where the display device 100 is slotted into the wearable member 400, the display device 100 may be fixed to the wearable member 400. In other words, the display system may be constituted by a wearable display device including the wearable member 400 and the display device 100 and by the control device 200.

As illustrated in FIG. 2, the wearable member 400 includes, for example, lenses 410 corresponding to the eyes of the user. The lenses 410 are magnifying lenses for forming images in the eyes of the user. When being worn on the head of the user, the wearable member 400 positions the lenses 410 in front of eyes E of the user. The user views display regions of the display device 100 magnified by the lenses 410. Therefore, the display device 100 needs to have a high resolution to clearly display the images (screens). In the present disclosure, the description has been made by exemplifying one pair of the lenses. However, for example, a plurality of pairs of lenses may be provided, and the display device 100 may be disposed in a position different from the front of the eyes.

The control device 200 displays, for example, an image on the display device 100. For example, an electronic apparatus such as a personal computer or a game console can be used as the control device 200. Examples of a virtual image include images such as a computer graphic video and a 360-degree live action video. The control device 200 outputs a three-dimensional image obtained by using parallax between the eyes of the user to the display device 100. The control device 200 outputs images for the right eye and the left eye that follow the direction of the head of the user to the display device 100.

Figure 3:
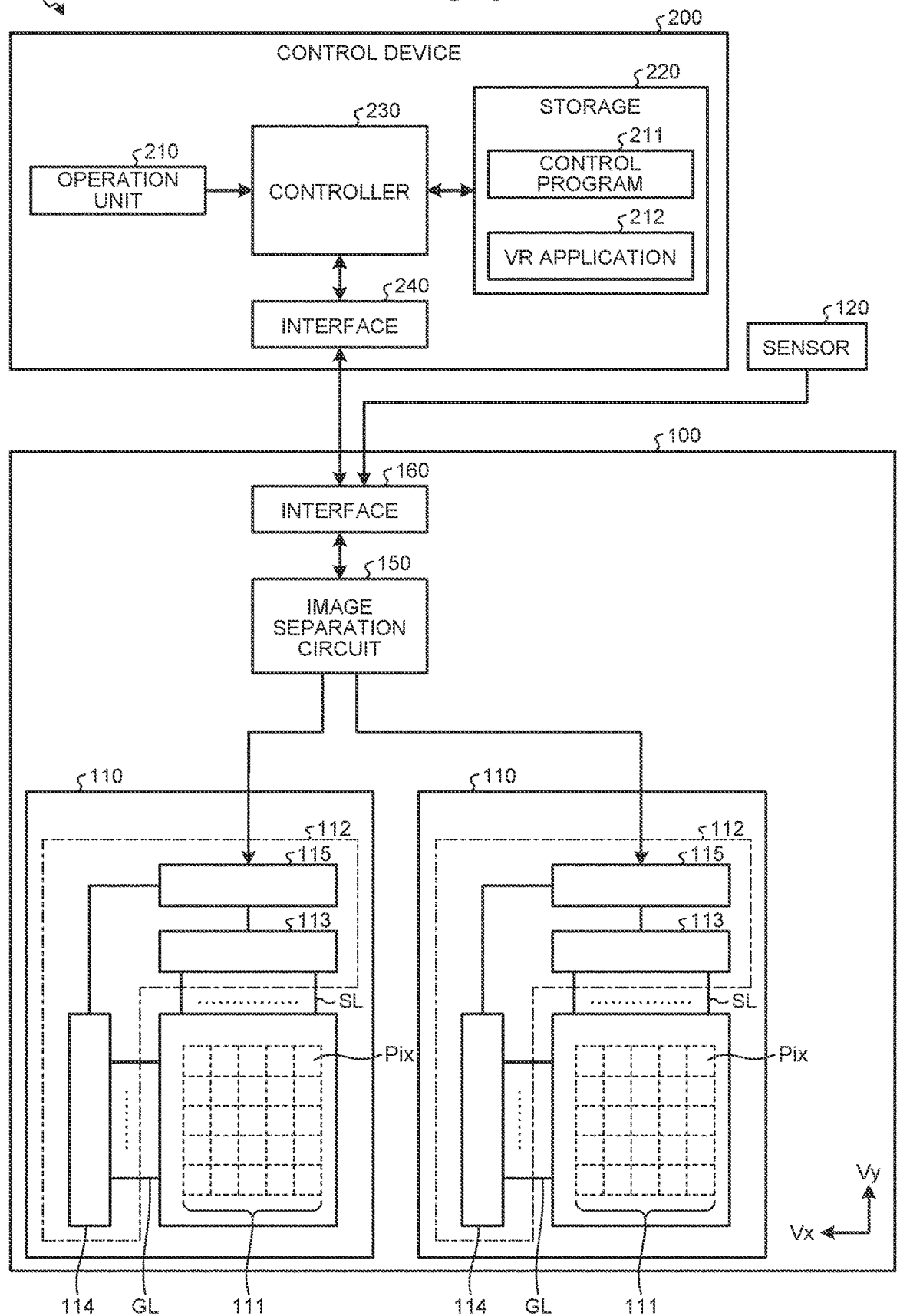
FIG. 3 is a block diagram illustrating an exemplary configuration of the display system according to the first embodiment.

FIG. 3 is a block diagram illustrating an exemplary configuration of the display system according to the first embodiment. As illustrated in FIG. 3, the display device 100 includes the two display panels 110, the sensor 120, an image separation circuit 150, and an interface 160.

The display device 100 is constituted by the two display panels 110, one of which being used as a display panel 110 for the left eye, and the other of which being used as a display panel 110 for the right eye.

Each of the two display panels 110 includes a display region 111 and a display control circuit 112. The display panel 110 includes an unillustrated light source device (backlight IL to be described later) that irradiates the display region 111 from behind.

In the display region 111, $P_0 \times Q_0$ pixels Pix ($P_0$ pixels in the row direction and $Q_0$ pixels in the column direction) are arranged in a two-dimensional matrix having a row-column configuration. In the present embodiment, $P_0=2880$, and $Q_0=1700$. FIG. 3 schematically illustrates the arrangement of the pixels Pix. The detailed arrangement of the pixels Pix will be described later.

The display panel 110 includes scan lines extending in a direction Vx and signal lines extending in a direction Vy intersecting the direction Vx. The display panel 110 includes, for example, 2880 signal lines SL and 1700 scan lines GL. In the display panel 110, the pixels Pix are arranged in regions surrounded by the signal lines SL and the scan lines GL. The pixels Pix include switching elements (thin film transistors (TFTs)) coupled to the signal lines SL and the scan lines GL, and pixel electrodes coupled to the switching elements. Each of the scan lines GL is coupled to the pixels Pix arranged along the extending direction of the scan line GL. Each of the signal lines SL is coupled to the pixels Pix arranged along the extending direction of the signal line SL.

The display region 111 of one of the two display panels 110 is used for the right eye, and the display region 111 of the other of the two display panels 110 is used for the left eye. In the first embodiment, a case is described where the display panels 110 include the two display panels 110 for the right eye and the left eye. However, the display device 100 is not limited to the structure using the two display panels 110 as described above. For example, one display panel 110 may be used, and the display region of the one display panel 110 may be divided into two regions such that the right half region displays an image for the right eye and the left half region displays an image for the left eye.

The display control circuit 112 includes a driver integrated circuit (IC) 115, a signal line coupling circuit 113, and a scan line drive circuit 114. The signal line coupling circuit 113 is electrically coupled to the signal lines SL. The driver IC 115 causes the scan line drive circuit 114 to control on/off of the switching elements (for example, the TFTs) for controlling operations (optical transmittance) of the pixels Pix. The scan line drive circuit 114 is electrically coupled to the scan lines GL.

The sensor 120 detects information that enables estimation of the direction of the head of the user. For example, the sensor 120 detects information indicating the movement of the display device 100 or the wearable member 400, and the display system 1 estimates the direction of the head of the user wearing the display device 100 on the head based on the information indicating the movement of the display device 100 or the wearable member 400.

The sensor 120 detects information that enables estimation of the direction of a line of sight using, for example, at least one of the angle, the acceleration, the angular velocity, the azimuth, and the distance of the display device 100 or the wearable member 400. For example, a gyroscope sensor, an acceleration sensor, and/or an orientation sensor can be used for the sensor 120. For the sensor 120, for example, the gyroscope sensor may be used to detect the angle and the angular velocity of the display device 100 or the wearable member 400. For the sensor 120, for example, the acceleration sensor may be used to detect the direction and the magnitude of the acceleration acting on the display device 100 or the wearable member 400. For the sensor 120, for example, the orientation sensor may be used to detect the azimuth of the display device 100. For the sensor 120, for example, a distance sensor or a Global Positioning System (GPS) receiver may be used to detect the movement of the display device 100 or the wearable member 400. Another sensor, such as a photosensor, or a combination of a plurality of sensors may be used for the sensor 120, as long as a sensor or sensors are used for detecting the direction of the head, a change in the line of sight, the movement, or the like of the user. The sensor 120 is electrically coupled to the image separation circuit 150 through the interface 160 (to be described later).

The image separation circuit 150 receives image data for the left eye and image data for the right eye transmitted from the control device 200 through the cable 300, and transmits the image data for the left eye to the display panel 110 that displays the image for the left eye and the image data for the right eye to the display panel 110 that displays the image for the right eye.

The interface 160 includes a connector coupled to the cable 300 (FIG. 1). The interface 160 receives signals from the control device 200 through the coupled cable 300. The image separation circuit 150 outputs signals received from the sensor 120 to the control device 200 through the interface 160 and an interface 240. The signals received from the sensor 120 includes the information that enables the estimation of the direction of the line of sight described above. The signals received from the sensor 120 may alternatively be output directly to a controller 230 of the control device 200 through the interface 160. The interface 160 may, for example, be a wireless communication device, and transmit and receive information to and from the control device 200 through the wireless communication.

The control device 200 includes an operation unit 210, a storage 220, the controller 230, and the interface 240.

The operation unit 210 receives an operation of the user. Input devices such as a keyboard, buttons, and a touchscreen can be used as the operation unit 210. The operation unit 210 is electrically coupled to the controller 230. The operation unit 210 outputs information corresponding to the operation to the controller 230.

The storage 220 stores therein a computer program and data. The storage 220 temporarily stores therein results of processing of the controller 230. The storage 220 includes a storage medium. Examples of the storage medium include a read-only memory (ROM), a random-access memory (RAM), a memory card, an optical disc, and a magneto-optical disk. The storage 220 may store therein data of the image to be displayed on the display device 100.

The storage 220 stores therein, for example, a control program 211 and a VR application 212. The control program 211 can provide, for example, functions related to various types of control for operating the control device 200. The VR application 212 can provide a function to display the image of the virtual reality on the display device 100. The storage 220 can store therein, for example, various types of information received from the display device 100, including, for example, data representing a detection result of the sensor 120.

The controller 230 includes, for example, a micro control unit (MCU) or a central processing unit (CPU). The controller 230 can integrally control the operation of the control device 200. Various functions of the controller 230 are performed based on the control by the controller 230.

The controller 230 includes, for example, a graphics processing unit (GPU) that generates the image to be displayed. The GPU generates the image to be displayed on the display device 100. The controller 230 outputs the image generated by the GPU to the display device 100 through the interface 240. While, in the present embodiment, a case will be described where the controller 230 of the control device 200 includes the GPU, the present disclosure is not limited to this case. For example, the GPU may be provided in the display device 100 or the image separation circuit 150 of the display device 100. In that case, the display device 100 only needs to acquire data from, for example, the control device 200 or an external electronic apparatus, and use the GPU to generate the image based on the data.

The interface 240 includes a connector coupled to the cable 300 (FIG. 1). The interface 240 receives signals from the display device 100 through the cable 300. The interface 240 outputs signals received from the controller 230 to the display device 100 through the cable 300. The interface 240 may, for example, be a wireless communication device, and transmit and receive the information to and from the display device 100 through the wireless communication.

When the controller 230 executes the VR application 212, the controller 230 displays an image corresponding to the movement of the user (display device 100) on the display device 100. When the controller 230 has detected a change in the user (display device 100) while the image is displayed on the display device 100, the controller 230 changes the image displayed on the display device 100 to an image moved in the direction of the change. When the controller 230 starts to create the image, the controller 230 creates the image based on a reference point of view and a reference line of sight in the virtual space. When the controller 230 has detected the change in the user (display device 100), the controller 230 changes the point of view or the line of sight at the time of creating the displayed image from the reference point of view or the reference line-of-sight direction correspondingly to the movement of the user (display device 100), and displays an image based on the changed point of view or the changed line of sight on the display device 100.

For example, the controller 230 detects a rightward movement of the head of the user based on the detection result of the sensor 120. In this case, the controller 230 changes the image from the currently displayed image to an image obtained when the line of sight is changed rightward. The user can view the image in the rightward direction of the image displayed on the display device 100.

For example, when the controller 230 has detected a movement of the display device 100 based on the detection result of the sensor 120, the controller 230 changes the image correspondingly to the detected movement. When the controller 230 has detected that the display device 100 has moved forward, the controller 230 changes the image to an image obtained when the currently displayed image has moved forward. When the controller 230 has detected that the display device 100 has moved backward, the controller 230 changes the image to an image obtained when the currently displayed image has moved backward. The user can view the image moved in the direction of movement of the user from the image displayed on the display device 100.

Figure 4:
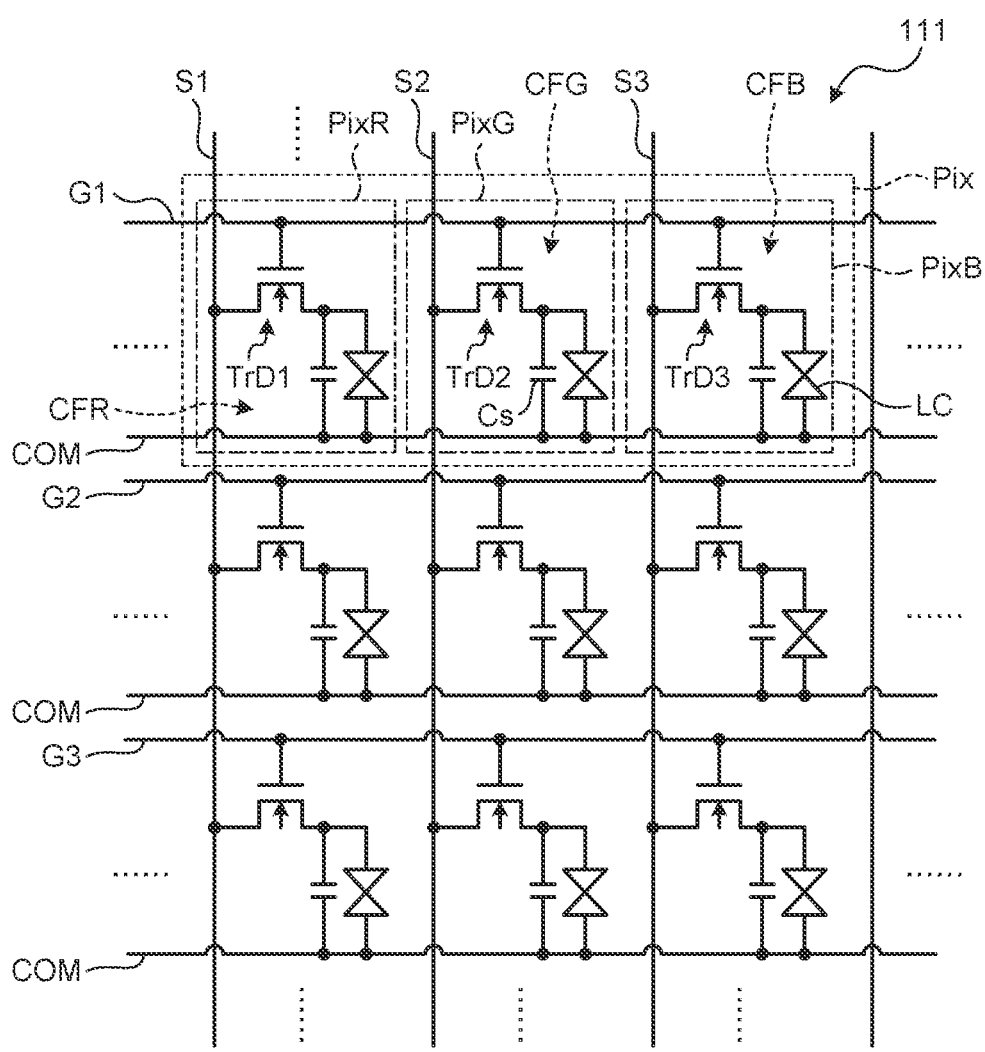
FIG. 4 is a circuit diagram illustrating a pixel arrangement in a display region according to the first embodiment.

FIG. 4 is a circuit diagram illustrating the pixel arrangement in the display region according to the first embodiment. In the following description, the term "scan lines GL" mentioned above is a collective term of a plurality of scan lines G1, G2, and G3. The term "signal lines SL" mentioned above is a collective term of a plurality of signal lines S1, S2, and S3. In the present disclosure, the scan lines GL do not intersect the signal lines SL at right angles. However, in FIG. 3, for convenience of explanation, the scan lines GL intersect the signal lines SL at right angles.

For example, switching elements TrD1, TrD2, and TrD3 of respective pixels PixR, PixG, and PixB, the signal lines SL, and the scan lines GL illustrated in FIG. 4 are formed in the display region 111. The signal lines S1, S2, and S3 are wiring for supplying pixel signals to pixel electrodes PE1, PE2, and PE3 (refer to FIG. 8). The scan lines G1, G2, and G3 are wiring for supplying gate signals to drive the switching elements TrD1, TrD2, and TrD3.

Each of the pixels Pix in the display region 111 illustrated in FIG. 4 includes the arranged pixels PixR, PixG, and PixB. Hereinafter, the pixels PixR, PixG, and PixB may be collectively referred to as the pixel Pix. Each of the pixels PixR, PixG, and PixB has capacitance of a corresponding one of the switching elements TrD1, TrD2, and TrD3 and a liquid crystal layer LC. Each of the switching elements TrD1, TrD2, and TrD3 is constituted by a thin film transistor, and in this example, constituted by an n-channel metal oxide semiconductor (MOS) TFT. A sixth insulating film 16 (refer to FIG. 8) is provided between the pixel electrodes PE1, PE2, PE3 and a common electrode COM, which will be described later, and these components provide storage capacitance Cs illustrated in FIG. 4.

For example, color regions colored in three colors of red (first color: R), green (second color: G), and blue (third color: B) are periodically arranged as color filters CFR, CFG, and CFB illustrated in FIG. 4. The three color regions of R, G, and B are associated with the pixels PixR, PixG, and PixB illustrated in FIG. 4 described above as one set. The pixels PixR, PixG, and PixB corresponding to the color regions of the three colors are considered as one set. The color filters may include four or more color regions. The pixels PixR, PixG, and PixB may each be called a sub-pixel.

Figure 5:
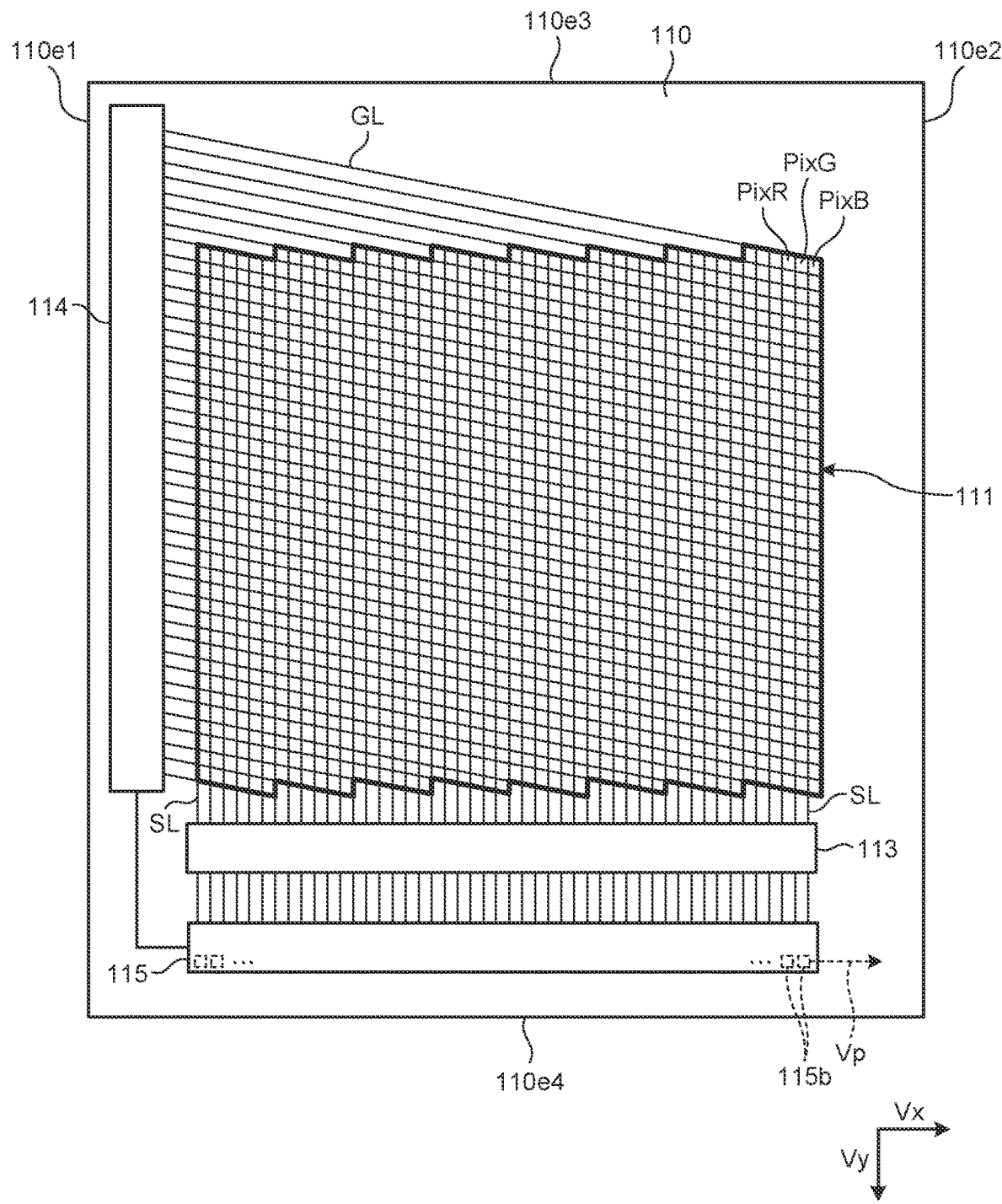
FIG. 5 is a schematic view illustrating an exemplary display panel according to the first embodiment.
Figure 6:
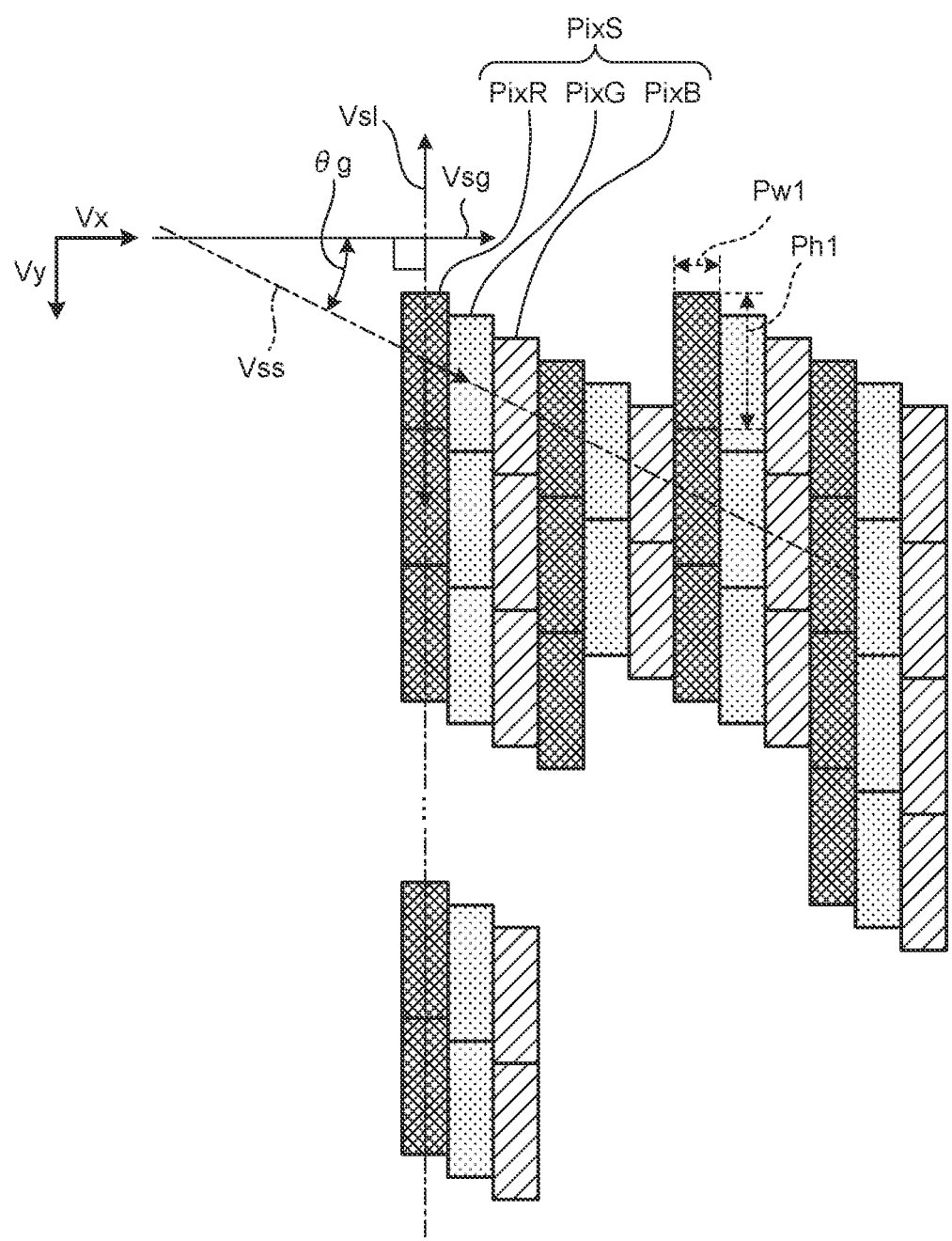
FIG. 6 is a schematic view schematically illustrating a magnified view of a portion of the display region in the first embodiment.
Figure 7:
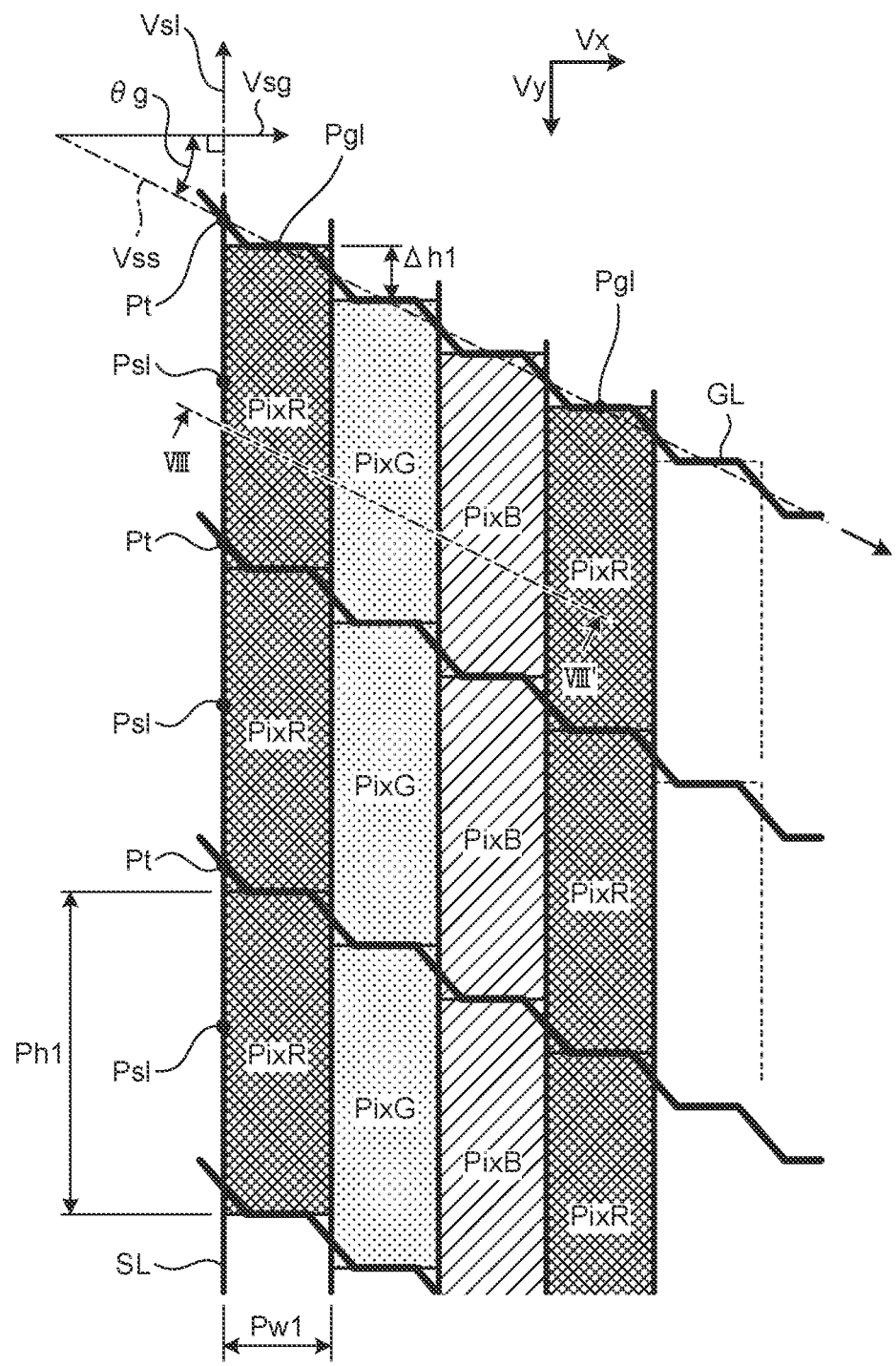
FIG. 7 is a schematic diagram illustrating a relation between signal lines and scan lines in FIG. 6.

FIG. 5 is a schematic view illustrating an exemplary display panel according to the first embodiment. FIG. 6 is a schematic view schematically illustrating a magnified view of a portion of the display region in the first embodiment. FIG. 7 is a schematic diagram illustrating a relation between the signal lines and the scan lines in FIG. 6. FIG. 8 is a sectional view schematically illustrating a section along VIII-VIII' in FIG. 7.

As illustrated in FIG. 5, the display panel 110 has a side 110e1, a side 110e2, a side 110e3, and a side 110e4 at substrate ends. A region of the display panel between the sides 110e1, 110e2, 110e3, and 110e4 at the substrate ends and the display region 111 is called a peripheral region.

The scan line drive circuit 114 is disposed in the peripheral region between the side 110e1 at a substrate end of the display panel 110 and the display region 111. The signal line coupling circuit 113 is disposed in the peripheral region between the side 110e4 at a substrate end of the display panel 110 and the display region 111. The driver IC 115 is disposed in the peripheral region between the side 110e4 at the substrate end of the display panel 110 and the display region 111.

The driver IC 115 is joined to terminals 115b with conductive members interposed therebetween in order to be electrically coupled to an array substrate SUB1 (refer to FIG. 8) (to be described later) of the display panel 110. The terminals 115b are generally arranged in one direction, and a direction Vp in which the terminals 115b are arranged is set to the direction Vx. The direction Vy is a direction orthogonal to the direction Vx. In the present embodiment, the sides 110e3 and 110e4 at substrate ends of the display panel 110 are parallel to the direction Vx. The sides 110e1 and 110e2 at substrate ends of the display panel 110 are parallel to the direction Vy.

As illustrated in FIG. 5, the direction in which the signal lines SL extend is parallel to the direction Vy. The direction in which the scan lines GL extend is parallel to neither the direction Vx nor the direction Vy. Since the direction in which the scan lines GL extend is non-orthogonal to the direction in which the signal lines SL extend, each of the pixels PixR, PixG, and PixB has, for example, a parallelogram shape.

The shape of each of the pixels PixR, PixG, and PixB is exemplified as a parallelogram shape, but is not limited to a parallelogram shape. For example, as illustrated in FIG. 6, the pixels PixR, PixG, and PixB are arranged so as to be offset from one another in the direction Vy. When a distance Pw1 denotes the length in the direction Vx of each of the pixels PixR, PixG, and PixB and a distance Ph1 denotes the length in the direction Vy of each of the pixels PixR, PixG, and PixB, a relation holds that Pw1:Ph1=1:3. The pixels PixR, PixG, and PixB may each be referred to as a sub-pixel PixS.

In FIG. 6, a direction Vsl is a direction in which the signal lines SL (refer to FIG. 5) extend. A direction Vsg orthogonal to the direction Vsl is parallel to the direction Vx. A direction Vss is a direction in which the scan lines GL (refer to FIG. 5) extend. The scan lines GL are inclined with respect to the direction Vx by an angle θg formed by the direction Vss and the direction Vsg. The directions Vsl and Vss will be explained in detail with reference to FIG. 7.

As illustrated in FIG. 7, the direction Vss is a direction in which a virtual line connecting together first reference positions Pgl in the pixels PixR coupled to one of the scan lines GL extends. For example, each of the first reference positions Pgl is located on the scan line GL, and is a midpoint between the signal lines SL that intersect the scan line GL in a plan view and are adjacent to each other. The first reference position Pgl is not limited to this position, and may be, for example, the centroid of the area of the pixel PixR. The first reference position Pgl is defined with reference to the pixel PixR, but may be defined with reference to the pixel PixG or the pixel PixB instead of the pixel PixR.

As illustrated in FIG. 7, the direction Vsl is a direction in which a virtual line connecting together second reference positions Psi in the pixels PixR coupled to one of the signal lines SL extends. For example, each of the second reference positions Psi is located on the signal line SL, and is a midpoint between intersecting positions Pt at which the scan lines GL intersect the signal line SL in the plan view. The second reference position Psi is not limited to this position, and may be, for example, the centroid of the area of the pixel PixR. The second reference position Psi is defined with reference to the pixel PixR, but may be defined with reference to the pixel PixG or the pixel PixB instead of the pixel PixR.

As illustrated in FIG. 7, the pixel PixR and the adjacent pixel PixG are arranged so as to be offset from each other by a distance Δh1 in the direction Vsl. Two of the pixels PixR coupled to one of the scan lines GL are offset from each other by three times the distance Δh1. When half the distance Ph1 illustrated in FIG. 6 is equal to three times the distance Δh1 illustrated in FIG. 7, pixels of the same color, such as the pixels PixR, adjacent in the direction Vx are offset by half from each other in the direction Vsl. Therefore, the pixels of the same color take two types of positions in even-numbered columns and odd-numbered columns. As a result, horizontal black and white lines can be more finely displayed, and the substantial resolution of the display device 100 is improved. When the scan lines GL illustrated in FIG. 7 linearly extend along the direction Vss, each of the pixels PixR, PixG, and PixB has a parallelogram shape as illustrated in FIG. 5.

The following describes a sectional structure of the display panel 110 with reference to FIG. 8. In FIG. 8, the array substrate SUB1 uses a light-transmitting first insulating substrate 10 such as a glass substrate or a resin substrate as a base body. The array substrate SUB1 includes, for example, a first insulating film 11, a second insulating film 12, a third insulating film 13, a fourth insulating film 14, a fifth insulating film 15, the sixth insulating film 16, the signal lines S1 to S3, the pixel electrodes PE1 to PE3, the common electrode COM, and a first orientation film AL1 on a side of the first insulating substrate 10 facing the counter substrate SUB2. In the following description, a direction from the array substrate SUB1 to the counter substrate SUB2 is referred to as "upper side" or simply "above".

The first insulating film 11 is located above the first insulating substrate 10. The second insulating film 12 is located above the first insulating film 11. The third insulating film 13 is located above the second insulating film 12. The signal lines S1 to S3 are located above the third insulating film 13. The fourth insulating film 14 is located above the third insulating film 13, and covers the signal lines S1 to S3.

If required, wiring may be disposed above the fourth insulating film 14. This wiring will be covered with the fifth insulating film 15. In the present embodiment, the wiring is not disposed. The first insulating film 11, the second insulating film 12, the third insulating film 13, and the sixth insulating film 16 are each formed of a light-transmitting inorganic material such as silicon oxide or silicon nitride. Each of the fourth insulating film 14 and the fifth insulating film 15 is formed of a light-transmitting resin material, and has a larger film thickness than those of the other insulating films formed of the inorganic material. However, the fifth insulating film 15 may be formed of an inorganic material.

The common electrode COM is located above the fifth insulating film 15. The common electrode COM is covered with the sixth insulating film 16. The sixth insulating film 16 is formed of a light-transmitting inorganic material such as silicon oxide or silicon nitride.

The pixel electrodes PE1 to PE3 are located above the sixth insulating film 16, and face the common electrode COM with the sixth insulating film 16 interposed therebetween. The pixel electrodes PE1 to PE3 and the common electrode COM are each formed of a light-transmitting conductive material such as indium tin oxide (ITO) or indium zinc oxide (IZO). The first orientation film AL1 covers the pixel electrodes PE1 to PE3. The first orientation film AL1 also covers the sixth insulating film 16.

The counter substrate SUB2 uses a light-transmitting second insulating substrate 20 such as a glass substrate or a resin substrate as a base body. The counter substrate SUB2 includes, for example, a light-blocking layer BM, the color filters CFR, CFG, and CFB, an overcoat layer OC, and a second orientation film AL2 on a side of the second insulating substrate 20 facing the array substrate SUB1.

As illustrated in FIG. 8, the light-blocking layer BM is located on the side of the second insulating substrate 20 facing the array substrate SUB1. The light-blocking layer BM defines the size of an opening facing each of the pixel electrodes PE1 to PE3. The light-blocking layer BM is formed of a black resin material or a light-blocking metal material.

The color filters CFR, CFG, and CFB are each located on the side of the second insulating substrate 20 facing the array substrate SUB1, and ends of each thereof overlap the light-blocking layer BM. The color filter CFR faces the pixel electrode PE1. The color filter CFG faces the pixel electrode PE2. The color filter CFB faces the pixel electrode PE3. In one example, the color filters CFR, CFG, and CFB are formed of resin materials colored in blue, red, and green, respectively.

The overcoat layer OC covers the color filters CFR, CFG, and CFB. The overcoat layer OC is formed of a light-transmitting resin material. The second orientation film AL2 covers the overcoat layer OC. The first orientation film AL1 and the second orientation film AL2 are formed of, for example, a material that exhibits horizontal orientation.

As described above, the counter substrate SUB2 includes, for example, the light-blocking layer BM and the color filters CFR, CFG, and CFB. The light-blocking layer BM is disposed in a region facing wiring parts such as the scan lines G1, G2, and G3, the signal lines S1, S2, and S3, contact parts PA1, PA2, and PA3, and the switching elements TrD1, TrD2, and TrD3 illustrated in FIG. 4.

In FIG. 8, the counter substrate SUB2 includes the three color filters CFR, CFG, and CFB, but may include color filters of four or more colors including color filters of other colors different from blue, red, and green, such as white, transparent, yellow, magenta, cyan, and so on. The color filters CFR, CFG, and CFB may be provided on the array substrate SUB1.

In FIG. 8, the color filters CF are provided on the counter substrate SUB2. However, what is called a color-filter-on-array (COA) structure may be employed in which the color filters CF are provided on the array substrate SUB1.

The array substrate SUB1 and the counter substrate SUB2 described above are arranged such that the first orientation film AL1 faces the second orientation film AL2. The liquid crystal layer LC is enclosed between the first orientation film AL1 and the second orientation film AL2. The liquid crystal layer LC is constituted by a negative liquid crystal material having negative dielectric anisotropy or a positive liquid crystal material having positive dielectric anisotropy.

The array substrate SUB1 faces the backlight IL, and the counter substrate SUB2 is located on a display surface side. Although various forms of the backlight IL are applicable, the detailed structure thereof will not be described.

A first optical element OD1 including a first polarizing plate PL1 is disposed on an outer surface of the first insulating substrate 10 or a surface thereof facing the backlight IL. A second optical element OD2 including a second polarizing plate PL2 is disposed on an outer surface of the second insulating substrate 20 or a surface on a viewing position side thereof. A first polarizing axis of the first polarizing plate PL1 and a second polarizing axis of the second polarizing plate PL2 are in a positional relation of crossed Nicols in an XY plane, for example. The first optical element OD1 and the second optical element OD2 may each include other optical functional elements such as a retardation plate.

For example, when the liquid crystal layer LC is formed of a negative liquid crystal material and no voltage is applied to the liquid crystal layer LC, major axes of liquid crystal molecules LM are initially oriented along a predetermined direction in a Vx-Vy plane. In contrast, when a voltage is applied to the liquid crystal layer LC, that is, in an on-state where an electric field is formed between the pixel electrodes PE1 to PE3 and the common electrode COM, the liquid crystal molecules LM are affected by the electric field and change the orientation state thereof. In the on-state, incident linearly polarized light changes in polarization state according to the orientation state of the liquid crystal molecules LM when the light passes through the liquid crystal layer LC.

As described above, the display device 100 has the display region 111 viewed through each of the lenses 410. The display region 111 is provided on the array substrate SUB1. The display region 111 includes the pixels PixR, PixG, and PixB, the scan lines GL extending in the first direction Vss, and the signal lines SL extending in the second direction Vsl. The first direction Vss is non-parallel and non-orthogonal to the direction orthogonal to the second direction Vsl. Groups of the first pixels PixR, the second pixels PixG, and the third pixels PixB are each continuously arranged in the second direction Vsl. One of the first pixels PixR and another of the first pixels PixR arranged next thereto in the first direction Vss are arranged so as to be offset from each other by half the distance Ph1 of the first pixel PixR in the second direction Vsl. This configuration improves the substantial resolution of the display device 100.

Figure 9A:
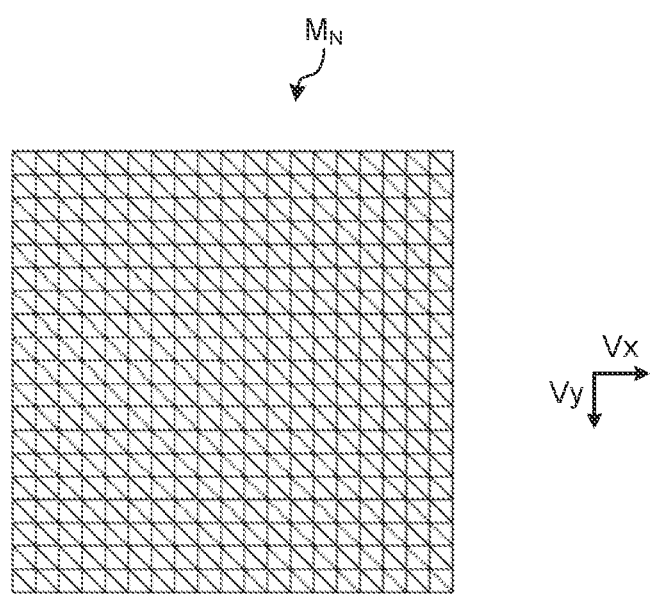
FIG. 9A is a diagram illustrating exemplary images received by the display system according to the first embodiment.

Since the direction Vss in which the scan lines GL extend is non-orthogonal to the direction Vsl in which the signal lines SL extend, the display system 1 performs compensation processing on the image such that the image recognized by the user is not distorted. FIG. 9A is a diagram illustrating exemplary images received by the display system according to the first embodiment. FIG. 9B is a diagram illustrating an example of the compensation processing to compensate for the distortion of the images displayed by the display system according to the first embodiment.

In the example illustrated in FIG. 9A, images Mn to be displayed for the user are arranged in a matrix having a row-column configuration in the direction Vx and the direction Vy. The GPU of the controller 230 illustrated in FIG. 3 calculates first compensated images MI by performing an image deformation process for correcting lens distortion of the lens 410 (refer to FIG. 2) on the images Mn illustrated in FIG. 9A. The GPU of the controller 230 illustrated in FIG. 3 calculates second compensated images Mg by performing an image deformation process for compensating for distortion that deforms the images Mn illustrated in FIG. 9A due to the influence of the angle θg. The GPU of the controller 230 illustrated in FIG. 3 transmits, to the display device 100, third compensated images MIg obtained by superimposing the first compensated images MI and the second compensated images Mg on the images Mn illustrated in FIG. 9A.

In FIG. 9B, the two image deformation processes to obtain the first compensated images MI and the second compensated images Mg for finally obtaining the third compensated images MIg are performed at once using a texture mapping method generally used in image processing using the GPU. Specifically, an image of a texture mapped to a polygon mesh (image) reflecting target distortion of the third compensated images MIg in FIG. 9B is a distorted image element of the third compensated images MIg to be obtained. Therefore, by keeping the polygon mesh (image) corresponding to the third compensated images MIg in the storage 220, or by generating the polygon mesh (image) of the third compensated images MIg by calculation by the controller 230 at the start of the display system 1, the polygon mesh (image) can be applied when each frame is displayed. As a result, the final target result of the third compensated images MIg can be obtained by performing the texture mapping processing only once. This method does not increase the number of image processing steps as compared with the general VR image distortion compensation processing that applies only the first compensated images MI without performing the processing of the second compensated images Mg, so that increase in cost due to the execution of the processing of the second compensated images Mg of the present embodiment can be restrained.

As described above, the control device 200 performs the second compensation processing to compensate for the distortion that deforms the image due to the influence of the angle θg formed by the first direction Vss in which the scan lines GL extend with respect to the direction Vsg orthogonal to the second direction Vsl. As a result, the display device 100 can cause the user to recognize the images Mn illustrated in FIG. 9A by displaying the third compensated images MIg.

The driver IC 115 of the display control circuit 112 described above may perform the second compensation processing. The driver IC 115 performs the second compensation processing to compensate for the distortion that deforms the image due to the influence of the angle θg. As a result, the control device 200 can reduce the computational load on the GPU.

Second Embodiment

In the first embodiment, the direction Vsl is parallel to the direction Vy. In a second embodiment, however, the direction Vsl is inclined by an angle θs with respect to the direction Vy. In the following description, the same components may be denoted by the same reference numerals. In addition, duplicate description will not be given.

Figure 10:
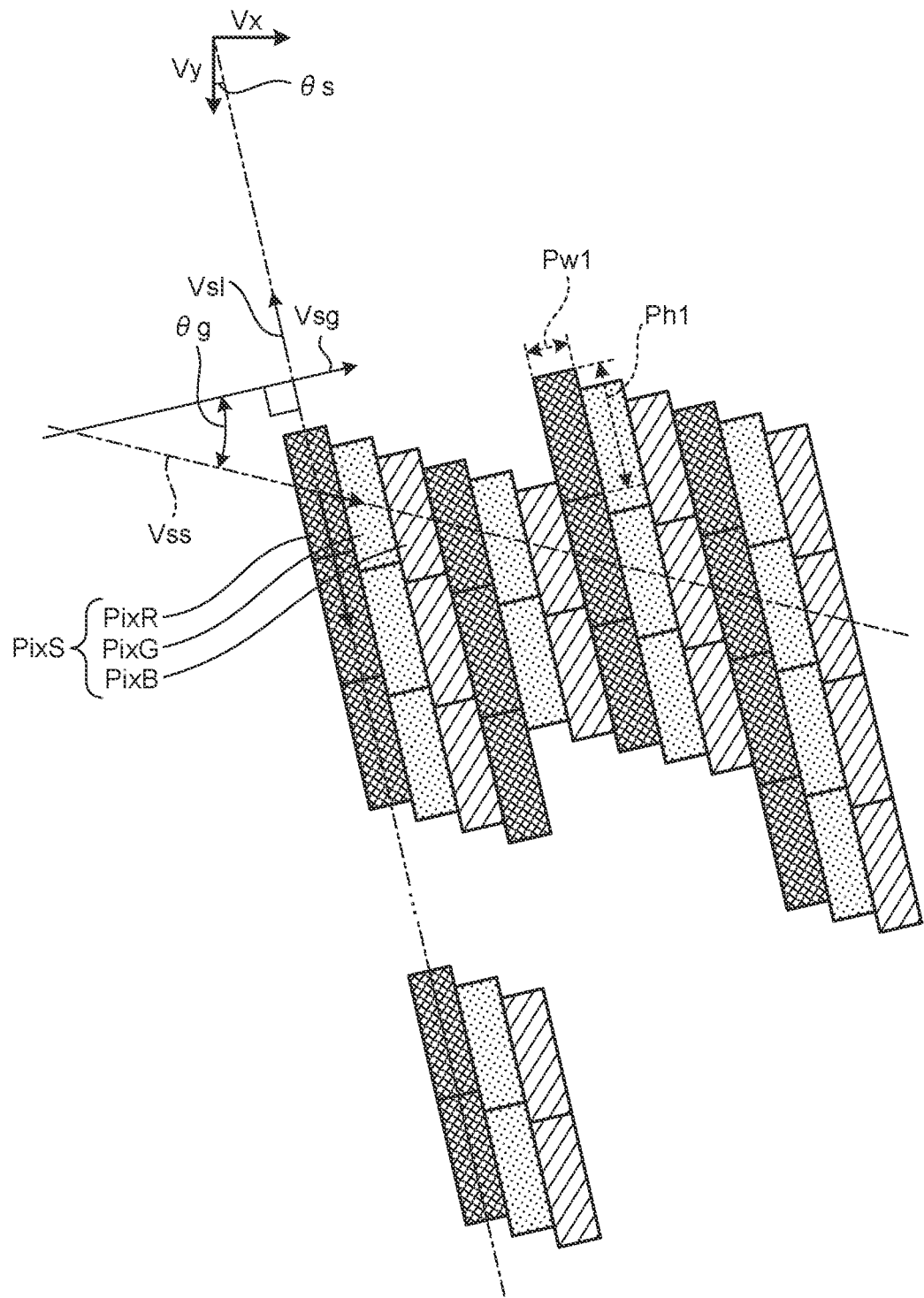
FIG. 10 is a schematic view schematically illustrating a magnified view of a portion of the display region as the display region according to a second embodiment.

In FIG. 10, the direction Vsl is the direction in which the signal lines SL (refer to FIG. 7) extend. The direction Vsg orthogonal to the direction Vsl has the angle θs with respect to the direction Vx. The direction Vss is the direction in which the scan lines GL (refer to FIG. 7) extend. As described above, the direction Vss and the direction Vsg form the angle θg. Therefore, the scan lines GL are inclined by an angle (θg−θs) with respect to the direction Vx.

In the display device 100 of the second embodiment, the scan lines GL are inclined with respect to the direction Vx by a smaller angle than in the display device 100 of the first embodiment. This configuration reduces the load of the image deformation process to reduce the influence of the angle θg formed by the direction of extension of the scan lines GL and the direction orthogonal to the direction of extension of the signal lines SL.

Third Embodiment

In the first embodiment, only one scan line drive circuit 114 is provided. In a third embodiment, however, two scan line drive circuits are provided. In the following description, the same components as those in the first or the second embodiment are denoted by the same reference numerals, and will not be described again.

Figure 11:
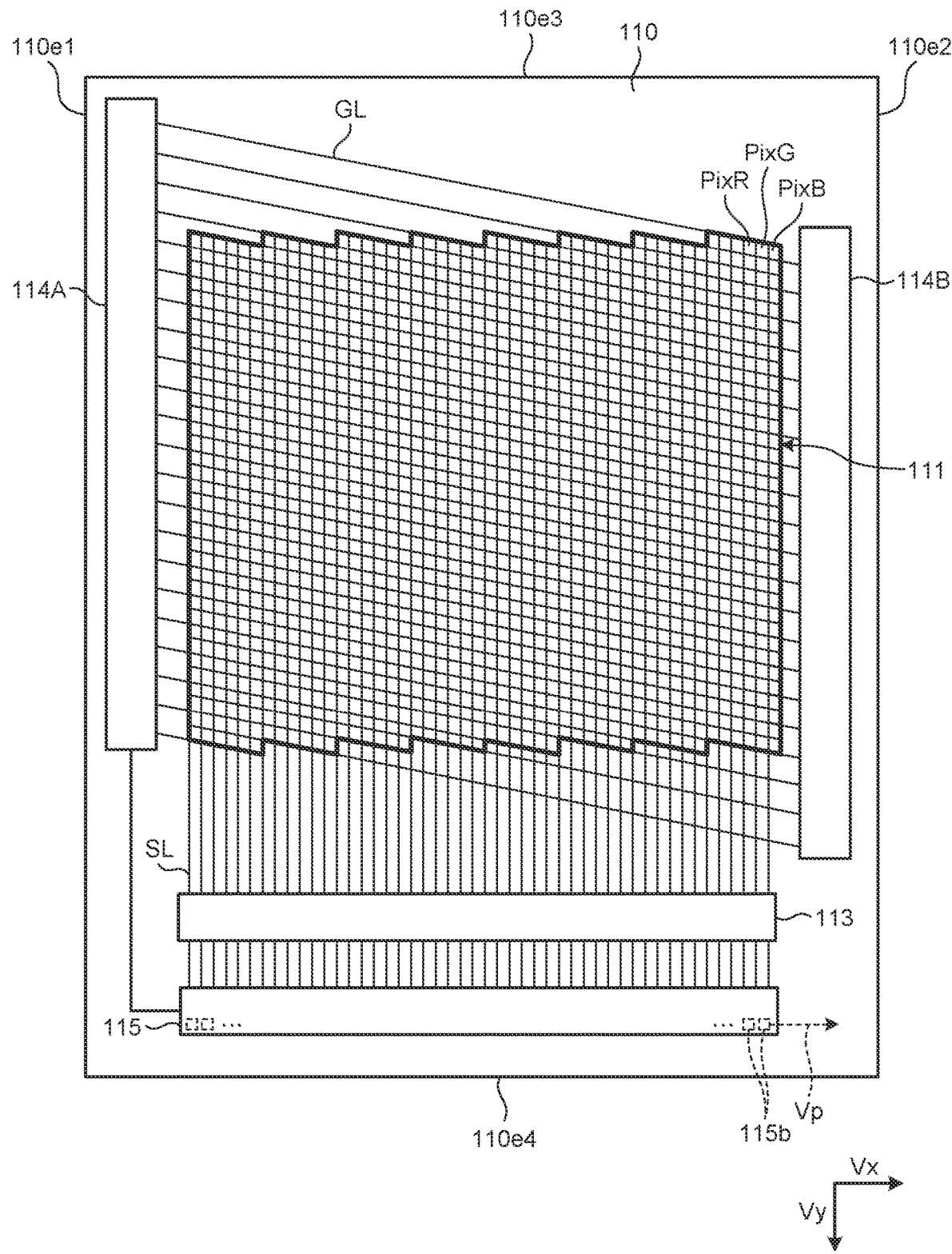
FIG. 11 is a schematic view illustrating an example of the display region according to a third embodiment.

FIG. 11 is a schematic view illustrating an example of the display region according to the third embodiment. As illustrated in FIG. 11, a first scan line drive circuit 114A is disposed in the peripheral region between the side 110e1 at the substrate end of the display panel 110 and the display region 111. A second scan line drive circuit 114B is disposed in the peripheral region between the side 110e2 at a substrate end of the display panel 110 and the display region 111. The second scan line drive circuit 114B is disposed on the opposite side of the first scan line drive circuit 114A with the display region 111 interposed therebetween. The scan lines GL coupled to the first scan line drive circuit 114A and the scan lines GL coupled to the second scan line drive circuit 114B are alternately arranged at predetermined intervals in the direction Vy. This configuration can halve the number of output circuits in each of the scan line drive circuits 114A and 114B, allowing the scan line drive circuits to be formed even when the pixel pitch is reduced.

Since the scan lines GL are inclined with respect to the direction Vx, the second scan line drive circuit 114B is offset from the first scan line drive circuit 114A in the direction Vy. A region surrounded by the signal lines SL and the scan lines GL can serve as any one of the pixels PixR, PixG, and PixB. Some regions closer to the side 110e4 at the substrate end do not serve as the display region 111 even if the regions are surrounded by the signal lines SL and the scan lines GL. Therefore, the scan lines GL coupled to the first scan line drive circuit 114A closer to the side 110e4 at the substrate end are shorter in length than the scan lines GL coupled to the second scan line drive circuit 114B. In contrast, the scan lines GL coupled to the second scan line drive circuit 114B closer to the side 110e3 at the substrate end are shorter in length than the scan lines GL coupled to first scan line drive circuit 114A.

Fourth Embodiment

In the third embodiment, the first scan line drive circuit 114A is disposed in a straight line extending in the direction Vy. In a fourth embodiment, however, the first scan line drive circuit 114A is bent. In the following description, the same components as those in any of the first to the third embodiments are denoted by the same reference numerals, and will not be described again.

Figure 12:
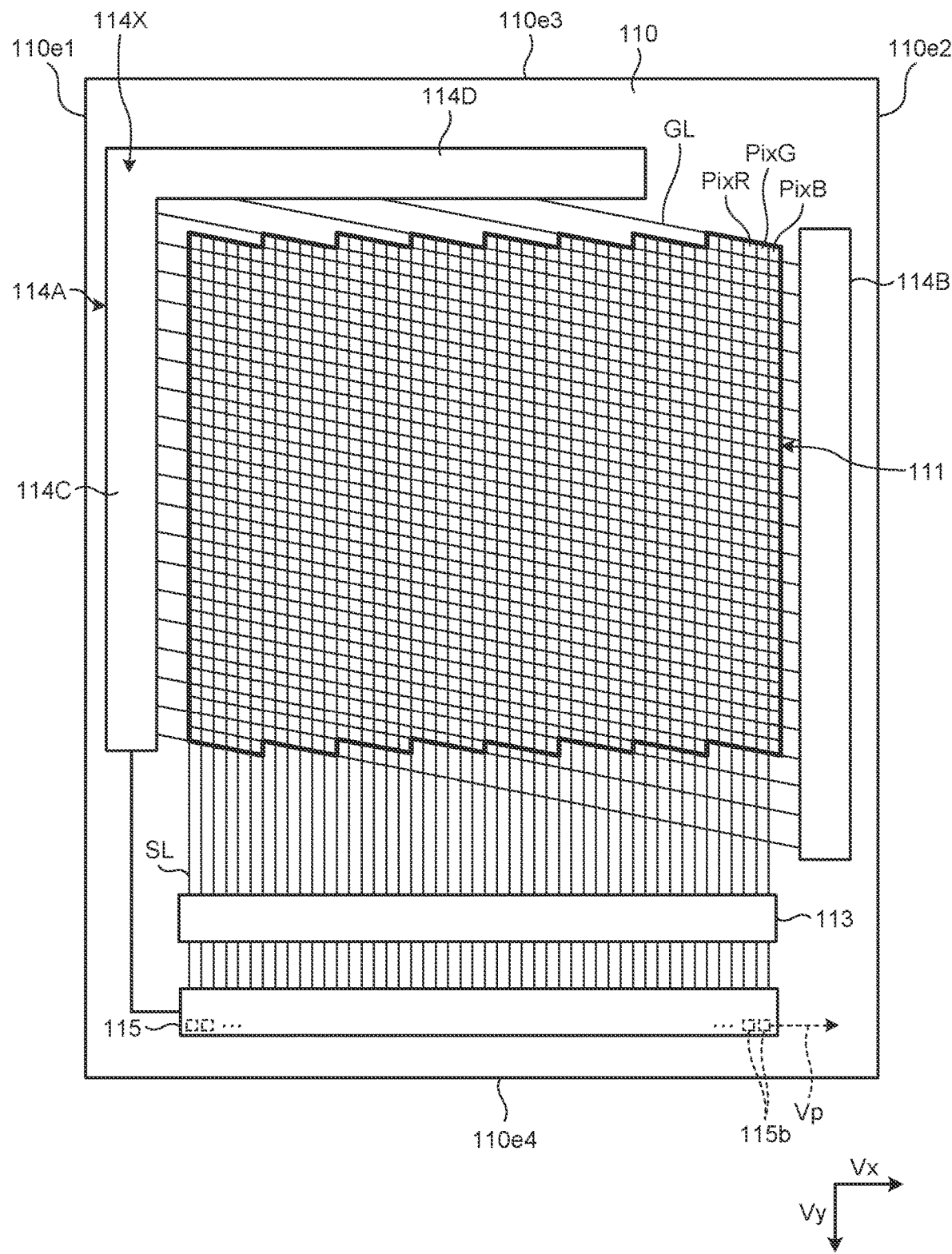
FIG. 12 is a schematic view illustrating an example of the display region according to a fourth embodiment.

FIG. 12 is a schematic view illustrating an example of the display region according to the fourth embodiment. Since the scan lines GL are inclined with respect to the direction Vx, the second scan line drive circuit 114B is offset from the first scan line drive circuit 114A in the direction Vy. Therefore, the first scan line drive circuit 114A has a straight line portion 114C extending in the direction Vy and a straight line portion 114D extending in the direction Vx. The straight line portion 114C is connected to the straight line portion 114D at a bent portion 114X. This configuration disposes the straight line portion 114D in the peripheral region between the side 110e3 at the substrate end and the display region 111, so that the display panel 110 of the fourth embodiment can be shorter in length in the direction Vy than that of the third embodiment.

Fifth Embodiment

In the first embodiment, the pixels Pix of the same color are continuously arranged in the direction Vsl. In a fifth embodiment, however, the pixels Pix of the same color are not continuously arranged in the direction Vsl. In the following description, the same components as those in any of the first to the fourth embodiments are denoted by the same reference numerals, and will not be described again.

Figure 13:
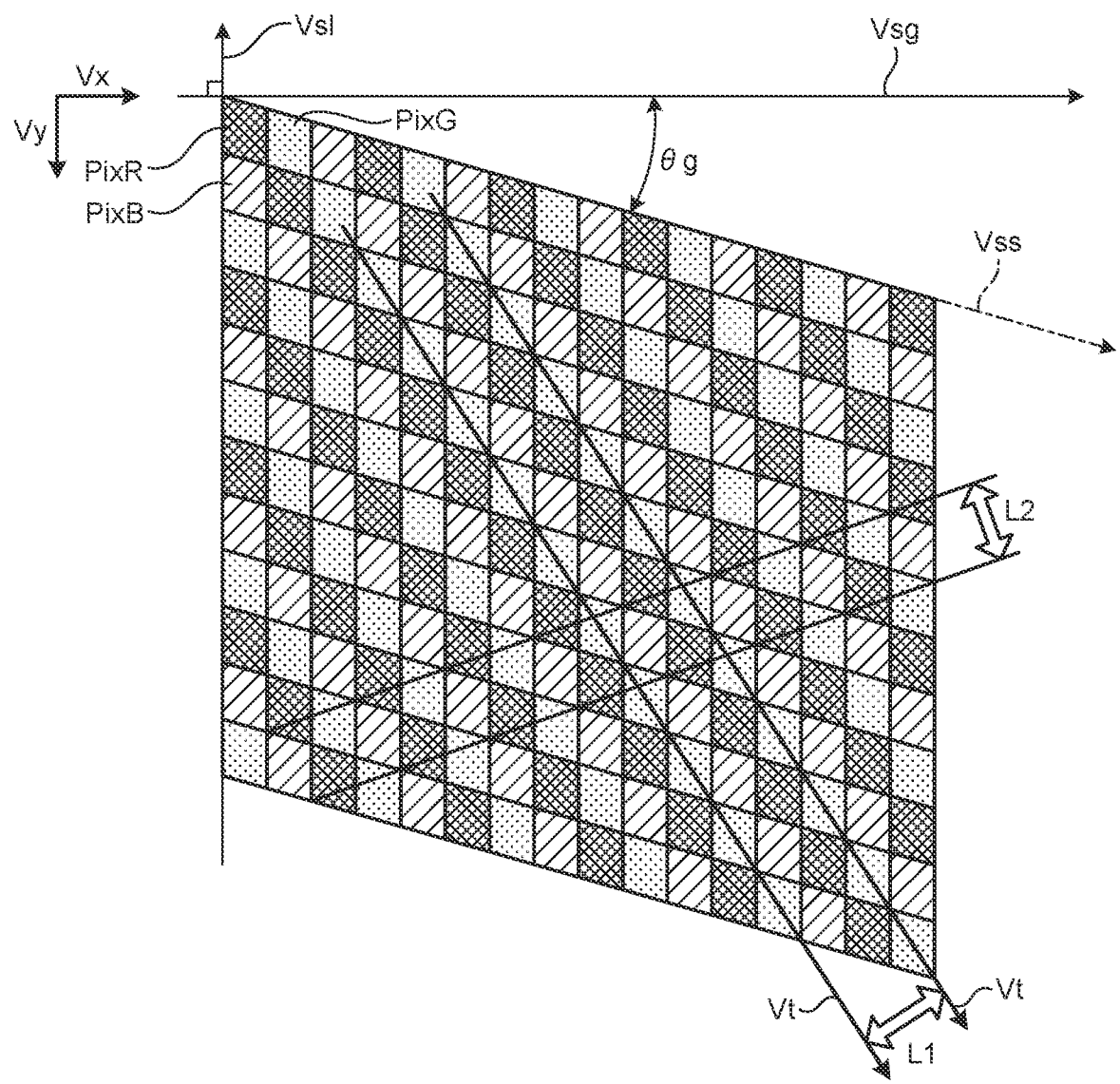
FIG. 13 is a schematic view schematically illustrating a magnified view of a portion of the display region in a fifth embodiment.
Figure 14:
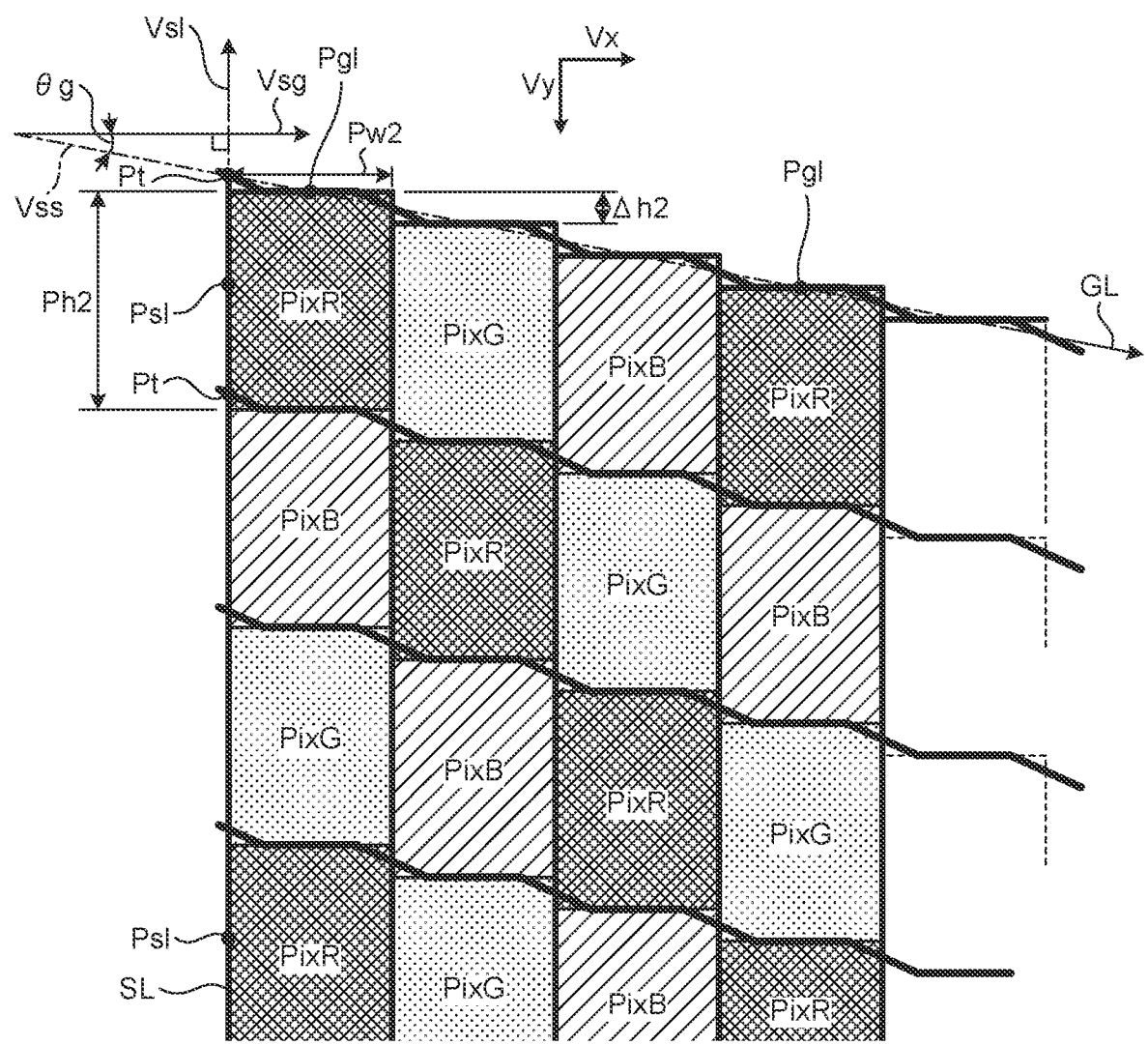
FIG. 14 is a schematic diagram illustrating a relation between the signal lines and the scan lines in FIG. 13.
Figure 15:
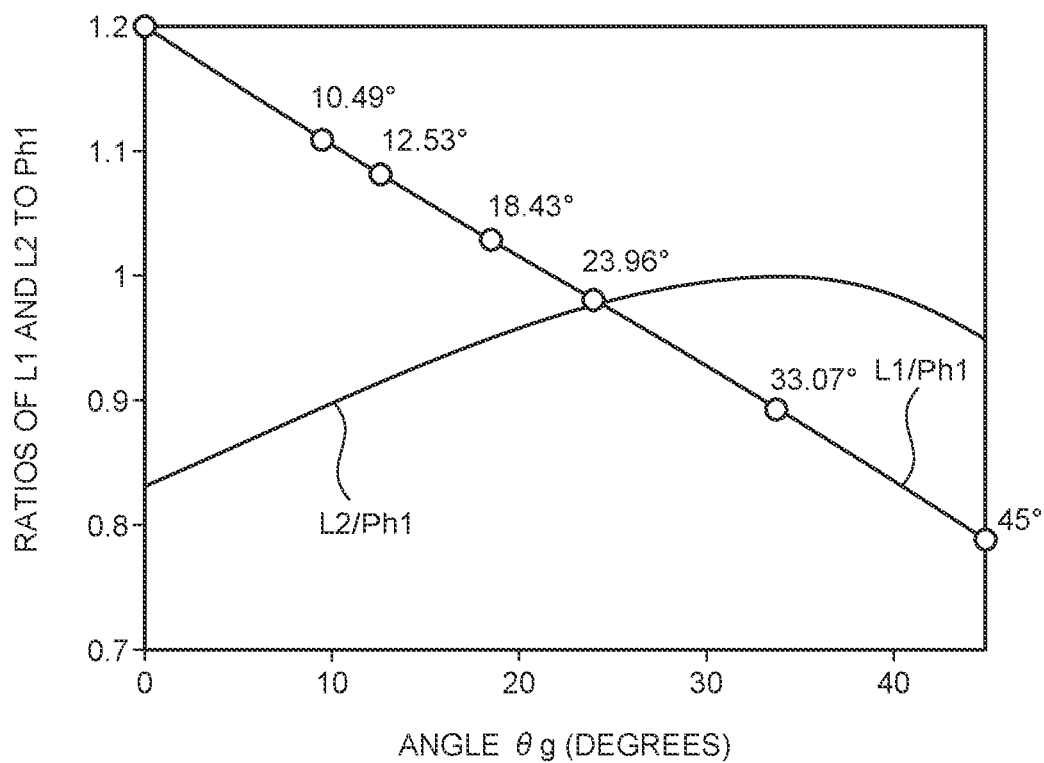
FIG. 15 is an explanatory diagram illustrating relations of ratios of same color pixel intervals to a reference distance in a second direction between the pixels with an inclination of the scan lines in the fifth embodiment.

FIG. 13 is a schematic view schematically illustrating a magnified view of a portion of the display region in the fifth embodiment. FIG. 14 is a schematic diagram illustrating a relation between the signal lines and the scan lines in FIG. 13. FIG. 15 is an explanatory diagram illustrating relations of ratios of same color pixel intervals to a reference distance in the second direction between the pixels with the inclination of the scan lines in the fifth embodiment. Also, in the fifth embodiment, the direction in which the signal lines SL extend is parallel to the direction Vy as illustrated in FIG. 5. The direction in which the scan lines GL extend is parallel to neither the direction Vx nor the direction Vy. Since the direction in which the scan lines GL extend is non-orthogonal to the direction in which the signal lines SL extend, each of the pixels PixR, PixG, and PixB has, for example, a parallelogram shape.

In FIG. 13, the direction Vsl is the direction in which the signal lines SL (refer to FIG. 5) extend. The direction Vsg orthogonal to the direction Vsl is parallel to the direction Vx. The direction Vss is the direction in which the scan lines GL (refer to FIG. 5) extend. The scan lines GL are inclined with respect to the direction Vx by the angle θg formed by the direction Vss and the direction Vsg. The directions Vsl and Vss will be explained in detail with reference to FIG. 14.

The shape of each of the pixels PixR, PixG, and PixB is exemplified as a parallelogram shape, but is not limited to a parallelogram shape. As illustrated in FIG. 14, the direction Vss is a direction in which a virtual line connecting together the first reference positions Pgl in the pixels PixR coupled to one of the scan lines GL extends. For example, each of the first reference positions Pgl is located on the scan line GL, and is a midpoint between the signal lines SL that intersect the scan line GL in the plan view and are adjacent to each other.

The direction Vsl is a direction in which a virtual line connecting together the second reference positions Psl in the pixels PixR coupled to one of the signal lines SL extends. For example, each of the second reference positions Psl is located on the signal line SL, and is a midpoint between intersecting positions Pt at which the scan lines GL intersect the signal line SL in the plan view.

As illustrated in FIG. 14, the pixel PixR and the adjacent pixel PixG are arranged so as to be offset from each other by a distance Δh2 in the direction Vsl. Δh2 is approximately equal to Pw2×tan (θg).

Since the display system 1 illustrated in FIG. 1 is worn on the head of the user, the display device 100 is desirably smaller. Since the display region 111 is viewed through the lens 410 in the situation where the size of the display panel 110 is limited in this manner, the Pixel Pix needs to be smaller in order to increase the resolution. For example, in the pixel arrangement illustrated in FIG. 7, the length in the direction Vx of each of the pixels PixR, PixG, and PixB is the distance Pw1. For example, if the distance Pw1 is reduced to 12 μm, the area ratio of the light-blocking layer BM described above increases and the aperture ratio decreases, which may increase the power consumption in order to ensure constant luminance.

Therefore, in the fifth embodiment, the pixels PixR, PixG, and PixB are arranged as illustrated in FIG. 13.

As illustrated in FIG. 13, the pixel PixR is disposed between the pixel PixB and the pixel PixG in the direction Vss, and is disposed between the pixel PixB and the pixel PixG in the direction Vsl.

In addition, the pixel PixG is disposed between the pixel PixR and the pixel PixB in the direction Vss, and is disposed between the pixel PixR and the pixel PixB in the direction Vsl.

Furthermore, the pixel PixB is disposed between the pixel PixG and the pixel PixR in the direction Vss, and is disposed between the pixel PixG and the pixel PixR in the direction Vsl.

The pixel PixR, the pixel PixG, and the pixel PixB are repeatedly arranged in this order in the direction Vss. The pixel PixR, the pixel PixG, and the pixel PixB are repeatedly arranged in this order in the direction Vsl.

In the pixel arrangement illustrated in FIG. 14, the length in the direction Vx of each of the pixels PixR, PixG, and PixB is a distance Pw2, and the length in the direction Vy of each of the pixels PixR, PixG, and PixB is a distance Ph2. The distance Pw2 is 3/2 times the distance Pw1 illustrated in FIG. 7, and the distance Ph2 is 2/3 times the distance Ph1 illustrated in FIG. 7. By arranging the pixels PixR, PixG, and PixB as illustrated in FIG. 13, the distance Pw2 can be sufficiently ensured, and the aperture ratio of each of the pixels PixR, PixG, and PixB can be improved. When the scan lines GL illustrated in FIG. 14 linearly extend along the direction Vss, each of the pixels PixR, PixG, and PixB has a parallelogram shape as illustrated in FIG. 5.

However, in the arrangement of the pixels PixR, PixG, and PixB as illustrated in FIG. 13, for example, the green pixels PixG highly visible to the user are continuously arranged obliquely (in a third direction Vt) with respect to the direction Vx. When the angle θg is 0 degrees, the pixels PixG look to the user as an oblique line, and are easily visually recognized. The phenomenon in which a pixel structure is visually recognized by the user is called a screen-door effect.

As described above, the display device 100 has the display region 111 viewed through each of the lenses 410. The display region 111 is provided on the array substrate SUB1. The display region 111 includes the pixels PixR, PixG, and PixB, the scan lines GL extending in the first direction Vss, and the signal lines SL extending in the second direction Vsl. In the display device 100 of the fifth embodiment, the screen-door effect is unlikely to occur when the direction Vss is non-parallel and non-orthogonal to the direction Vx, As described above, the direction Vss and the direction Vsg form the angle θg. In FIG. 13, the pixel intervals of the green pixels PixG highly visible to the user are L1 and L2. The distance Ph1 illustrated in FIG. 7 is used herein as a reference distance for comparison. FIG. 15 illustrates the relations of the angle θg with the ratios of the same color pixel intervals L1 and L2 to the distance Ph1 illustrated in FIG. 7.

As illustrated in FIG. 15, the intervals L1 and L2 between pixels of the same color change with the angle θg. Of the intervals L1 and L2, the interval L1 between pixels of the same color with pixels of different colors interposed therebetween needs to be reduced in order to improve the screen-door effect. When L1/Ph1 is from 0.9 to 1.1, the screen-door effect is smaller than when L1/Ph1 is 1.2, and the user is less likely to visually recognize an oblique line pattern. When L1/Ph1 is 0.8, the user may visually recognize the oblique line pattern.

Therefore, in the display device of the fifth embodiment, when the angle θg is from 10.49 degrees to 33.07 degrees, L1/Ph1 is from 0.9 to 1.1, and the screen-door effect is reduced. The screen-door effect decreases as the ratio between the interval L1 and the interval L2 is closer to one. Therefore, the screen-door effect is smaller when the angle θg is from 12.53 degrees to 23.96 degrees.

Sixth Embodiment

Figure 16:
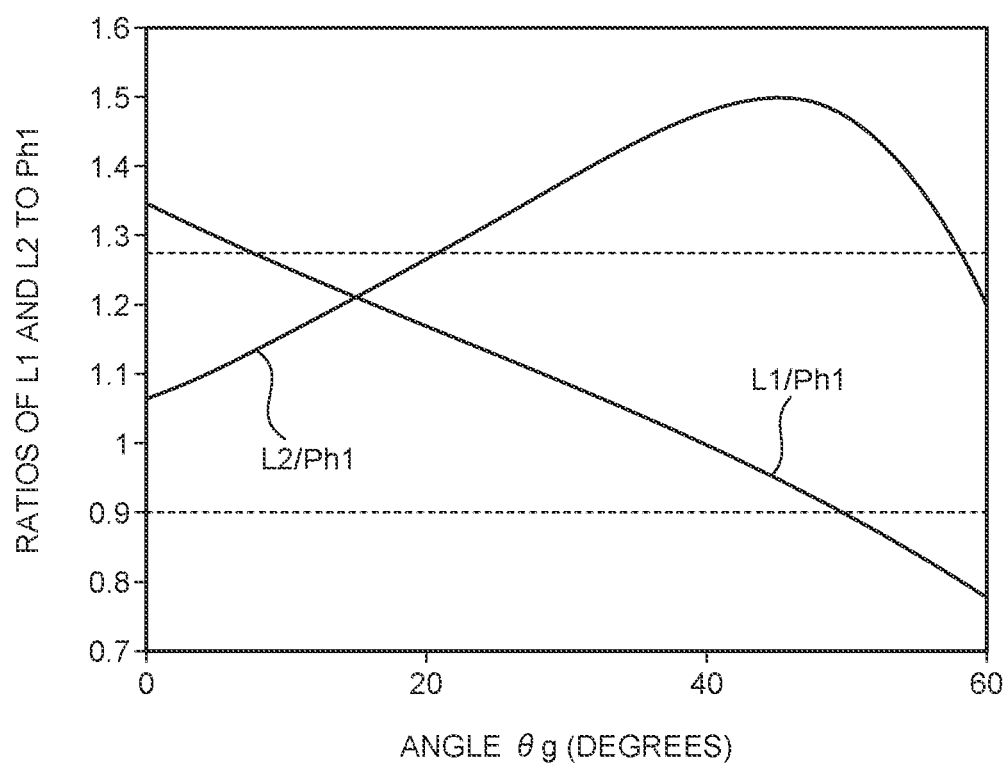
FIG. 16 is an explanatory diagram illustrating the relations of the ratios of the same color pixel intervals to the reference distance in the second direction between the pixels with the inclination of the scan lines in a sixth embodiment.

FIG. 16 is an explanatory diagram illustrating the relations of the ratios of the same color pixel intervals to the reference distance in the second direction between the pixels with the inclination of the scan lines in a sixth embodiment. In the fifth embodiment described above, in FIG. 14, the pixel arrangement has been described in which the distance Pw2 is 3/2 times the distance Pw1 illustrated in FIG. 7 and the distance Ph2 is 2/3 times the distance Ph1 illustrated in FIG. 7. The sixth embodiment differs from the fifth embodiment in that the length of the distance Ph2 described in the fifth embodiment is different. In the following description, the pixel arrangement of the sixth embodiment will be described with reference to FIGS. 13, 14 and 16. The same components as those in any of the first to the fifth embodiments are denoted by the same reference numerals, and will not be described again.

Also in the sixth embodiment, as illustrated in FIG. 14, the length in the direction Vx of each of the pixels PixR, PixG, and PixB in the pixel arrangement is the distance Pw2, and the length in the direction Vy of each of the pixels PixR, PixG, and PixB is the distance Ph2. In the sixth embodiment, the distance Pw2 illustrated in FIG. 14 is 3/2 times the distance Pw1 illustrated in FIG. 7, and the distance Ph2 illustrated in FIG. 14 is the same as the distance Ph1 illustrated in FIG. 7. By arranging the pixels PixR, PixG, and PixB as illustrated in FIG. 13, the distance Pw2 can be sufficiently ensured, and the aperture ratio of each of the pixels PixR, PixG, and PixB can be improved.

As illustrated in FIG. 16, the interval L1/Ph1 and the interval L2/Ph1 between the pixels of the same color change with the angle θg. For the pixel size of the sixth embodiment, when θg=0 degrees, the interval L1/Ph1 has a large value of 1.34, so that it is important to reduce L1/Ph1 in order not to cause the oblique lines to be visually recognized due to the screen-door effect.

When the interval L1/Ph1 is 1.275 or smaller, which is smaller by 5% than 1.34 obtained when θg=0, and the interval L1/Ph1 is 0.9 or larger, the screen-door effect is reduced, so that the user is less likely to visually recognize the oblique line pattern.

Therefore, in the display device of the sixth embodiment, when the angle θg is from 7.45 degrees to 49.72 degrees, L1 is from 1.275 to 0.9, so that the screen-door effect decreases.

Seventh Embodiment

In the first to the sixth embodiments, the display region 111 is substantially rectangular. However, the display region 111 according to a seventh embodiment is circular. In the following description, the same components as those in any of the first to the sixth embodiments are denoted by the same reference numerals, and will not be described again.

Figure 17:
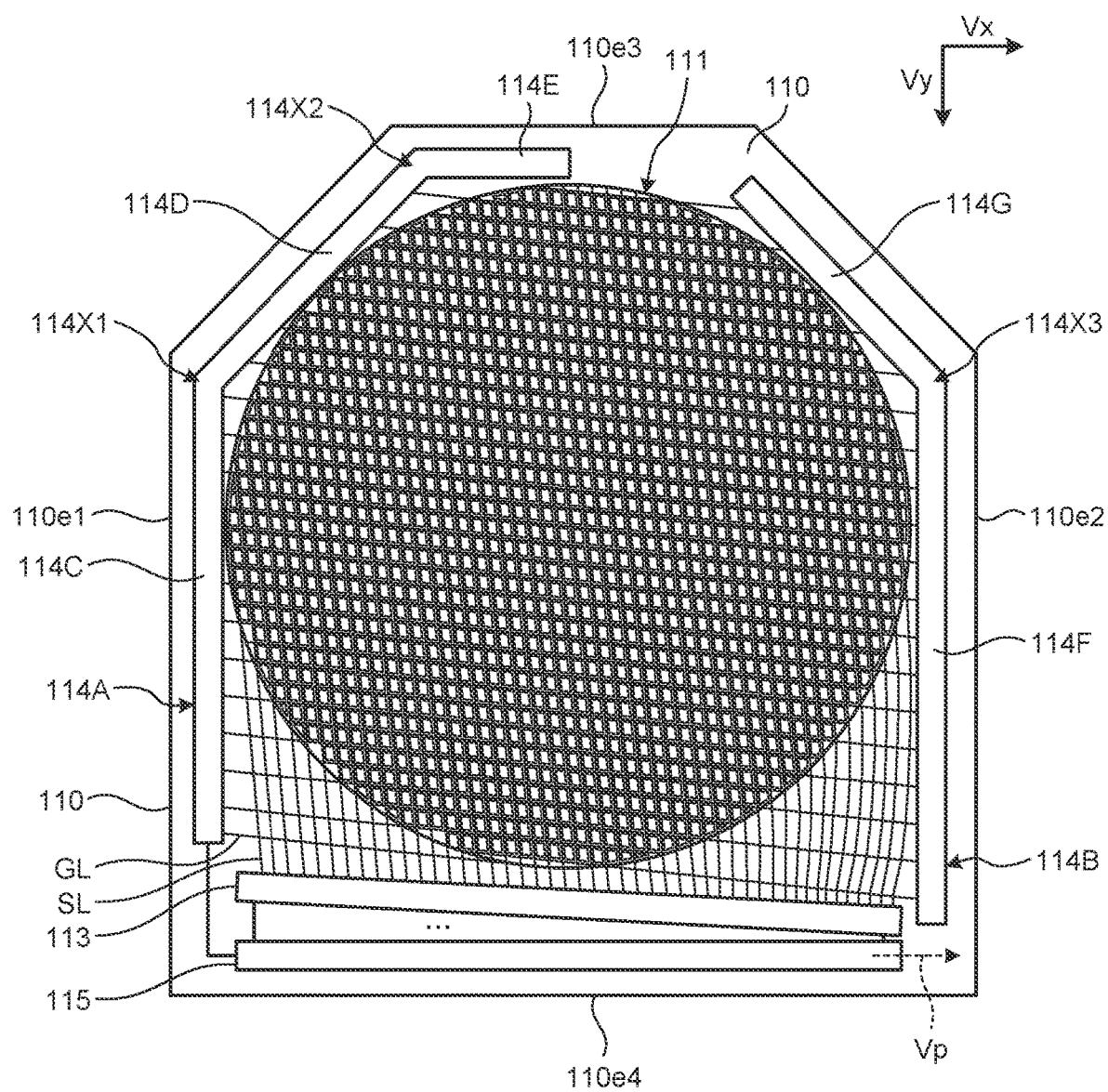
FIG. 17 is a schematic view illustrating an example of the display region according to a seventh embodiment.

FIG. 17 is a schematic view illustrating an example of the display region according to the seventh embodiment. The first scan line drive circuit 114A has the straight line portion 114C extending in the direction Vy, a straight line portion 114E extending in the direction Vx, and the straight line portion 114D connecting the straight line portion 114C to the straight line portion 114E. The straight line portion 114C is connected to the straight line portion 114D at a bent portion 114X1. The straight line portion 114D is connected to the straight line portion 114E at a bent portion 114X2. Since the display region 111 is circular, the straight line portion 114C, the straight line portion 114D, and the straight line portion 114E are along the display region 111. This configuration can make the peripheral region of the display panel 110 of the seventh embodiment smaller than that of the third embodiment.

The second scan line drive circuit 114B has a straight line portion 114F extending in the direction Vy and a straight line portion 114G extending in a direction inclined with respect to the direction Vy. The straight line portion 114F is connected to the straight line portion 114G at a bent portion 114X3. Since the display region 111 is circular, the straight line portion 114F and the straight line portion 114G are along the display region 111. This configuration can make the peripheral region of the display panel 110 of the seventh embodiment smaller than that of the third embodiment.

The signal line coupling circuit 113 of the seventh embodiment is non-parallel to the direction Vx.

As described above, the user views the display region of the display device 100 magnified by the lens 410. When the user views the display region 111 through the lens 410, peripheral portions of the display panel 110, particularly corner portions far from the center, are often located out of a field-of-view range of the lens and thus are invisible. Therefore, even when the display region 111 is circular, the user can visually recognize the image without any discomfort.

Eighth Embodiment

In the seventh embodiment, the display region 111 is circular. However, the display region 111 according to an eighth embodiment is polygonal. The same components as those in the first embodiment are denoted by the same reference numerals, and will not be described again.

Figure 18:
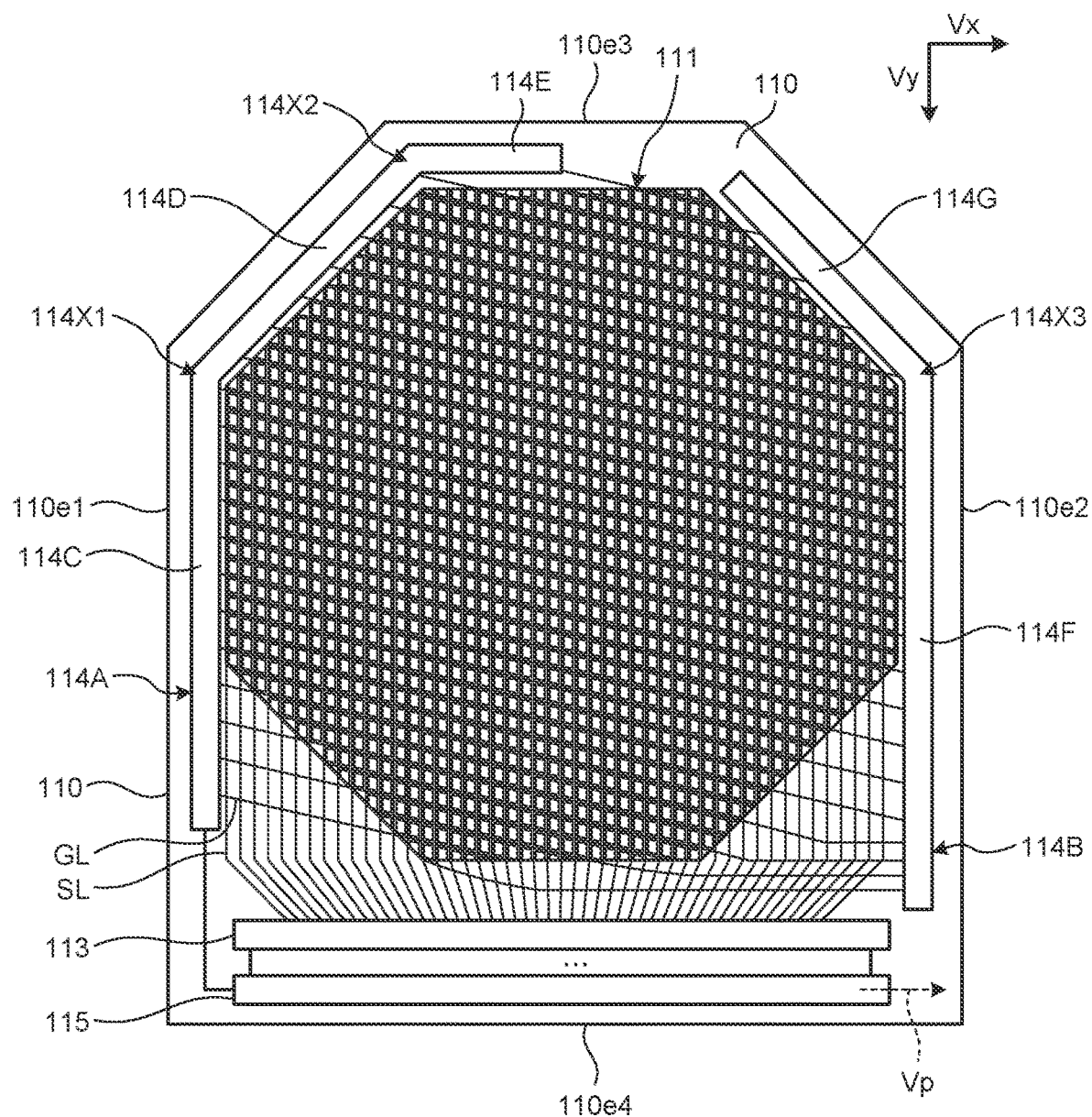
FIG. 18 is a schematic view illustrating an example of the display region according to an eighth embodiment.

FIG. 18 is a schematic view illustrating an example of the display region according to the eighth embodiment. The shape of the display region 111 of the eighth embodiment is a hexagon among polygons. This configuration reduces the area of a non-display region expanding from the straight line portions 114C, 114D, 114E, 114F, and 114G to the display region 111. As a result, the display panel 110 of the eighth embodiment can ensure the area of the display region 111 even though the peripheral region is reduced.

Ninth Embodiment

In a ninth embodiment, the order of arrangement of the pixels PixR, PixG, and PixB in the direction Vss differs from that of the fifth embodiment. The same components as those in any of the embodiments described above are denoted by the same reference numerals, and will not be described again.

Figure 19:
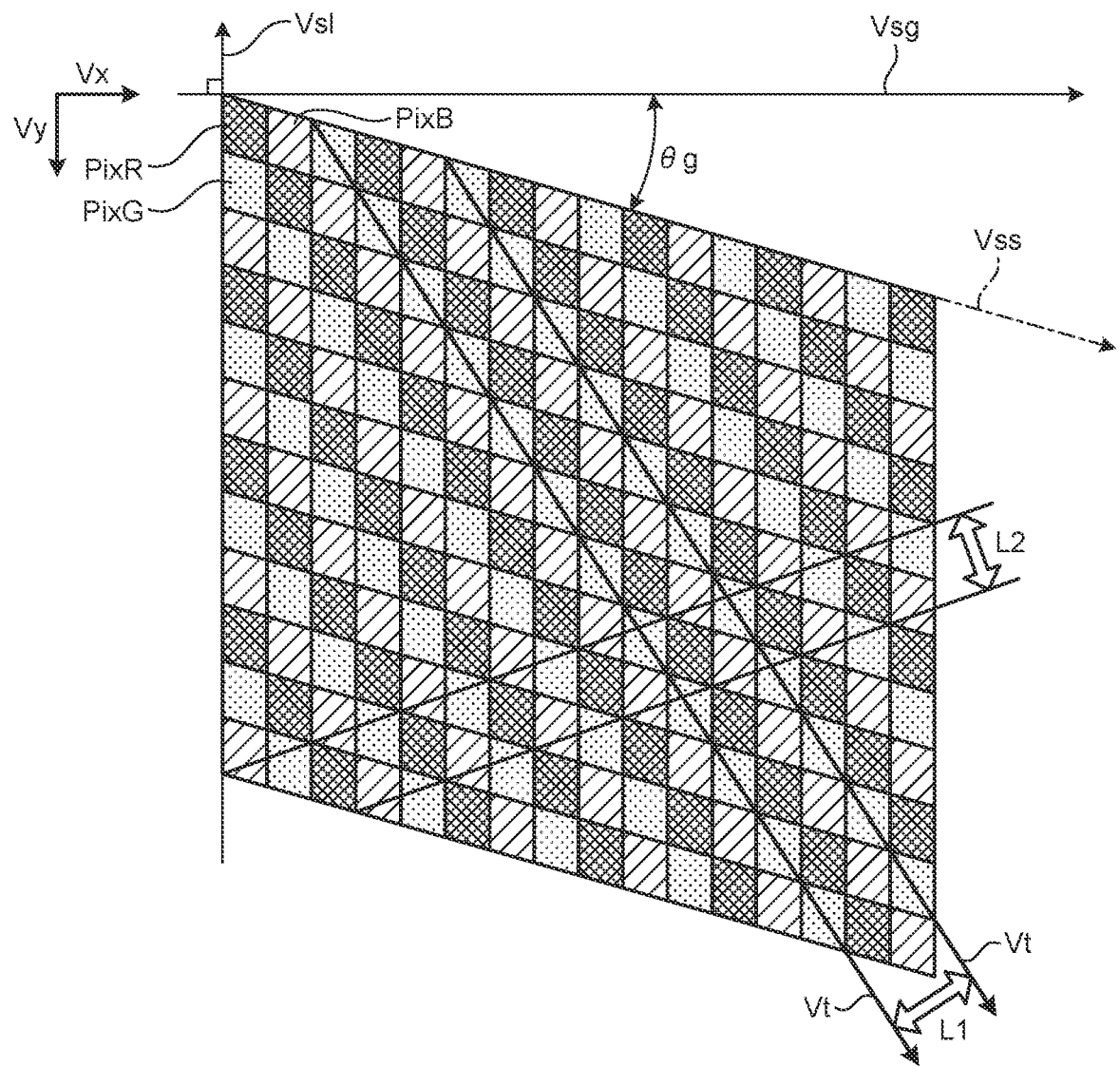
FIG. 19 is a schematic view schematically illustrating a magnified view of a portion of the display region in a ninth embodiment.

FIG. 19 is a schematic view schematically illustrating a magnified view of a portion of the display region in the ninth embodiment. As illustrated in FIG. 19, the pixel PixR is disposed between the pixel PixB and the pixel PixG in the direction Vss, and is disposed between the pixel PixB and the pixel PixG in the direction Vsl.

In addition, the pixel PixG is disposed between the pixel PixR and the pixel PixB in the direction Vss, and is disposed between the pixel PixR and the pixel PixB in the direction Vsl.

Furthermore, the pixel PixB is disposed between the pixel PixG and the pixel PixR in the direction Vss, and is disposed between the pixel PixG and the pixel PixR in the direction Vsl.

The pixel PixR, the pixel PixB, and the pixel PixG are repeatedly arranged in this order in the direction Vss. The pixel PixR, the pixel PixB, and the pixel PixG are repeatedly arranged in this order in the direction Vsl. The green pixels PixG highly visible to the user are continuously arranged obliquely (in the third direction Vt) with respect to the direction Vx. The same color pixel intervals L1 and L2 are the same as those in the fifth embodiment, and therefore, will not be described.

Tenth Embodiment

The inclination of the direction Vss is downward toward the right side in the fifth embodiment, whereas the inclination of the direction Vss is upward toward the right side in a tenth embodiment. The same components as those in any of the embodiments described above are denoted by the same reference numerals, and will not be described again.

Figure 20:
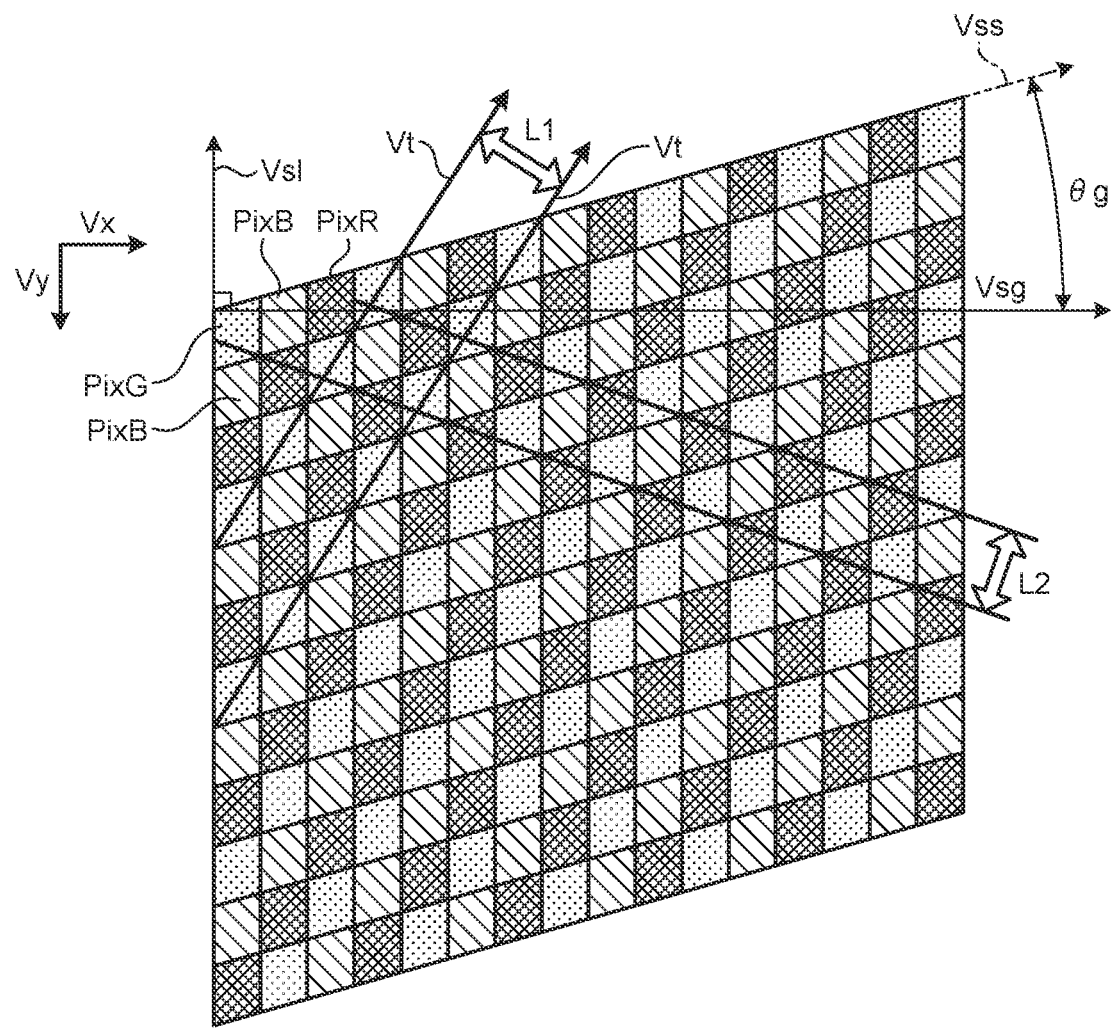
FIG. 20 is a schematic view schematically illustrating a magnified view of a portion of the display region in a tenth embodiment.

FIG. 20 is a schematic view schematically illustrating a magnified view of a portion of the display region in the tenth embodiment. As illustrated in FIG. 20, the pixel PixR is disposed between the pixel PixB and the pixel PixG in the direction Vss, and is disposed between the pixel PixB and the pixel PixG in the direction Vsl.

In addition, the pixel PixG is disposed between the pixel PixR and the pixel PixB in the direction Vss, and is disposed between the pixel PixR and the pixel PixB in the direction Vsl.

Furthermore, the pixel PixB is disposed between the pixel PixG and the pixel PixR in the direction Vss, and is disposed between the pixel PixG and the pixel PixR in the direction Vsl.

The pixel PixR, the pixel PixG, and the pixel PixB are repeatedly arranged in this order in the direction Vss. The pixel PixR, the pixel PixB, and the pixel PixG are repeatedly arranged in this order in the direction Vsl.

In FIG. 20, the direction Vsg orthogonal to the direction Vsl is parallel to the direction Vx. The direction Vss is the direction in which the scan lines GL extend. The scan lines GL are inclined with respect to the direction Vx by the angle θg formed by the direction Vss and the direction Vsg. The green pixels PixG highly visible to the user are continuously arranged obliquely (in the third direction Vt) with respect to the direction Vx. The same color pixel intervals L1 and L2 are the same as those in the fifth embodiment, and therefore, will not be described.

Eleventh Embodiment

In an eleventh embodiment, the order of arrangement of the pixels PixR, PixG, and PixB in the direction Vss differs from that of the tenth embodiment. The same components as those in any of the embodiments described above are denoted by the same reference numerals, and will not be described again.

Figure 21:
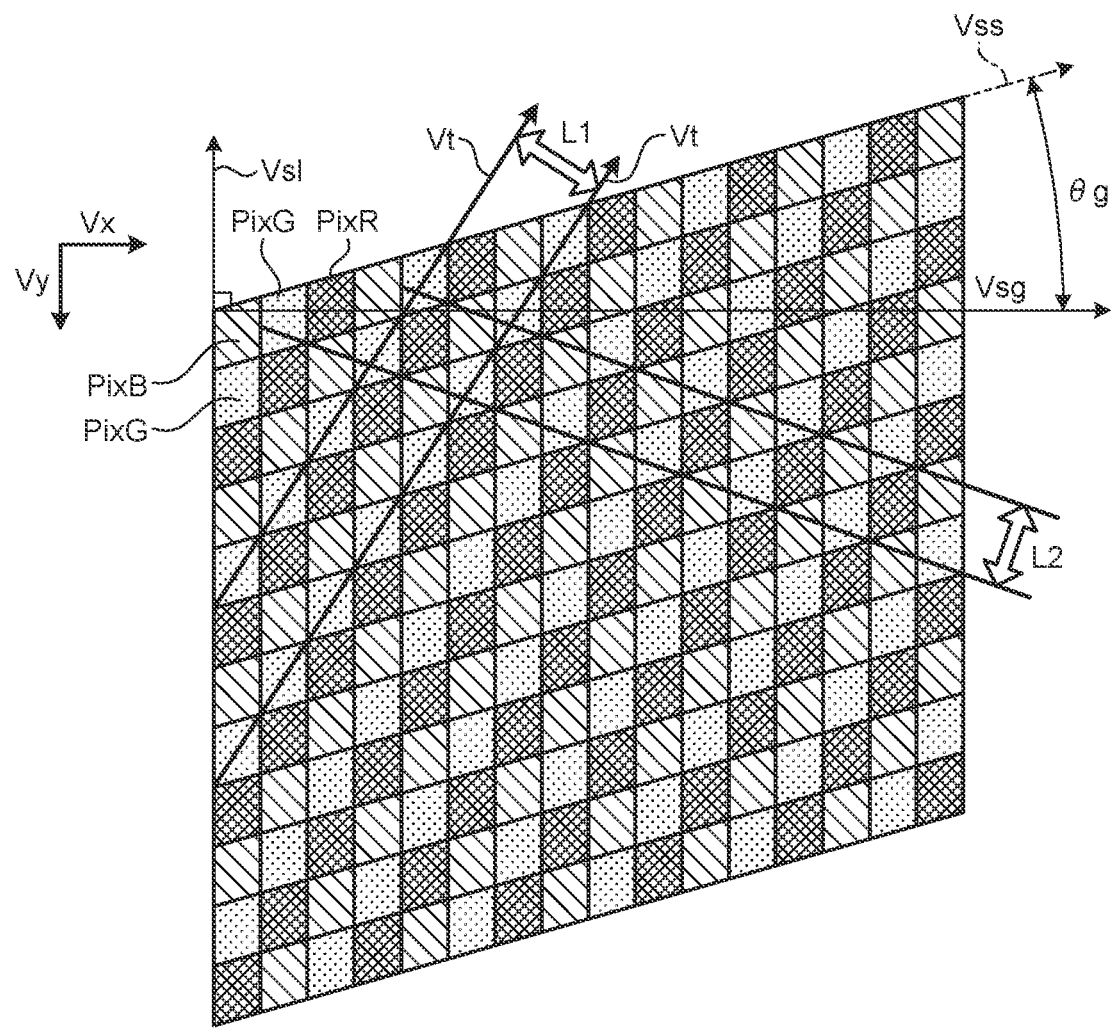
FIG. 21 is a schematic view schematically illustrating a magnified view of a portion of the display region in an eleventh embodiment.

FIG. 21 is a schematic view schematically illustrating a magnified view of a portion of the display region in the eleventh embodiment. As illustrated in FIG. 21, the pixel PixR is disposed between the pixel PixB and the pixel PixG in the direction Vss, and is disposed between the pixel PixB and the pixel PixG in the direction Vsl.

In addition, the pixel PixG is disposed between the pixel PixR and the pixel PixB in the direction Vss, and is disposed between the pixel PixR and the pixel PixB in the direction Vsl.

Furthermore, the pixel PixB is disposed between the pixel PixG and the pixel PixR in the direction Vss, and is disposed between the pixel PixG and the pixel PixR in the direction Vsl.

The pixel PixR, the pixel PixB, and the pixel PixG are repeatedly arranged in this order in the direction Vss. The pixel PixR, the pixel PixG, and the pixel PixB are repeatedly arranged in this order in the direction Vsl. The green pixels PixG highly visible to the user are continuously arranged obliquely (in the third direction Vt) with respect to the direction Vx. The same color pixel intervals L1 and L2 are the same as those in the fifth embodiment, and therefore, will not be described.

Twelfth Embodiment

In a twelfth embodiment, an example of the backlight IL (refer to FIG. 8) will be described. The same components as those in any of the embodiments described above are denoted by the same reference numerals, and will not be described again.

Figure 22:
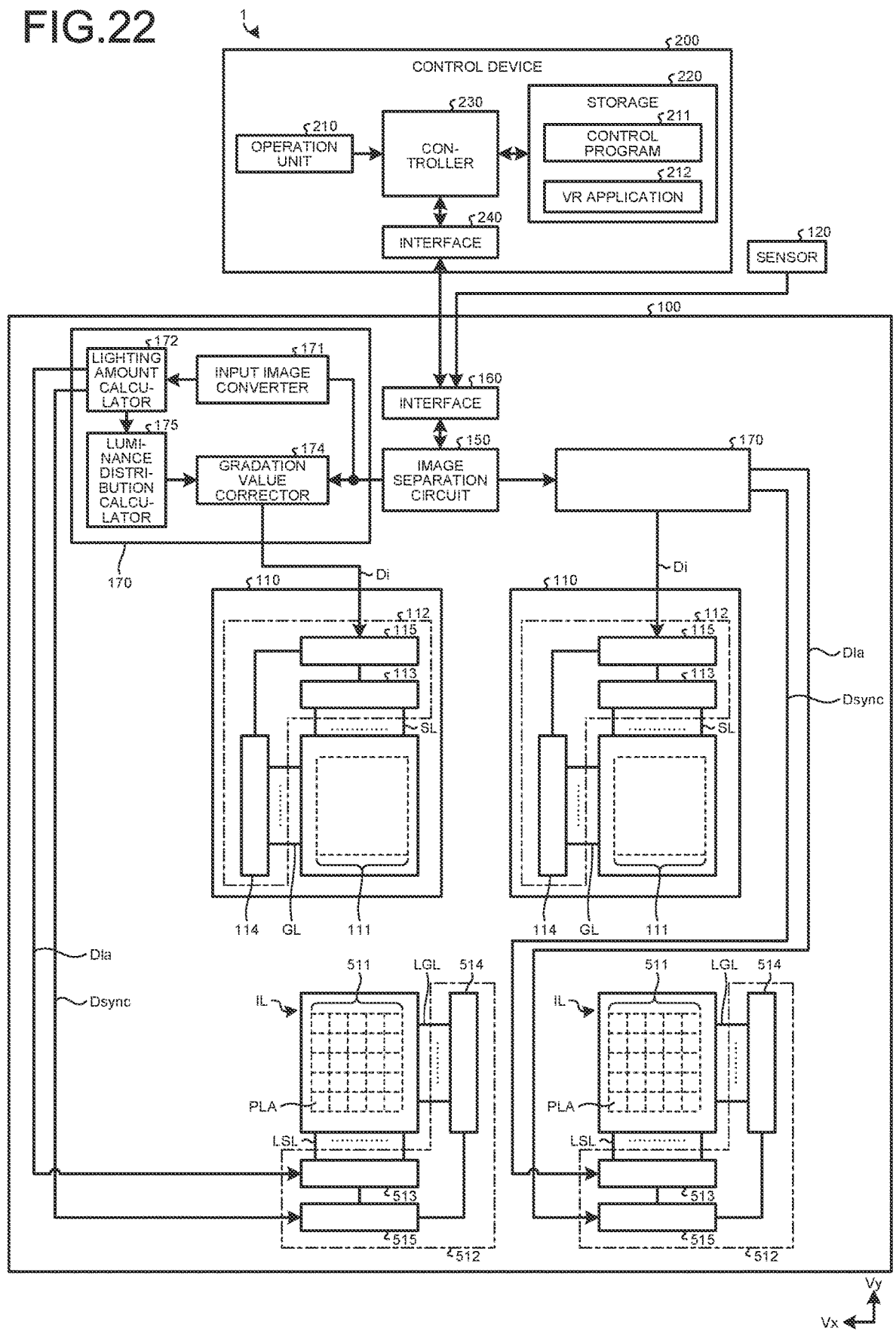
FIG. 22 is a block diagram illustrating an exemplary configuration of the display system according to a twelfth embodiment.
Figure 23:
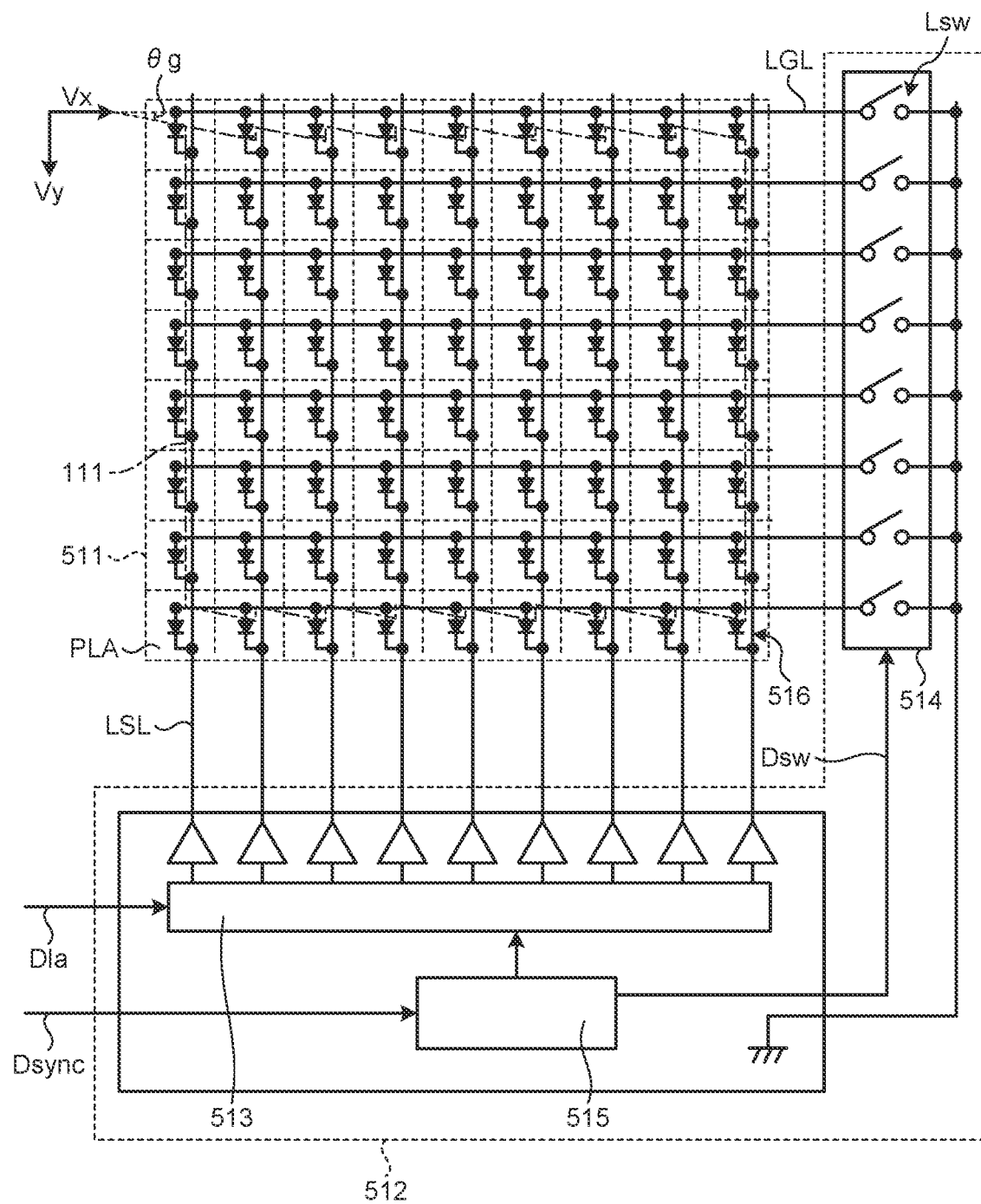
FIG. 23 is a schematic diagram illustrating an exemplary backlight according to the twelfth embodiment.
Figure 24:
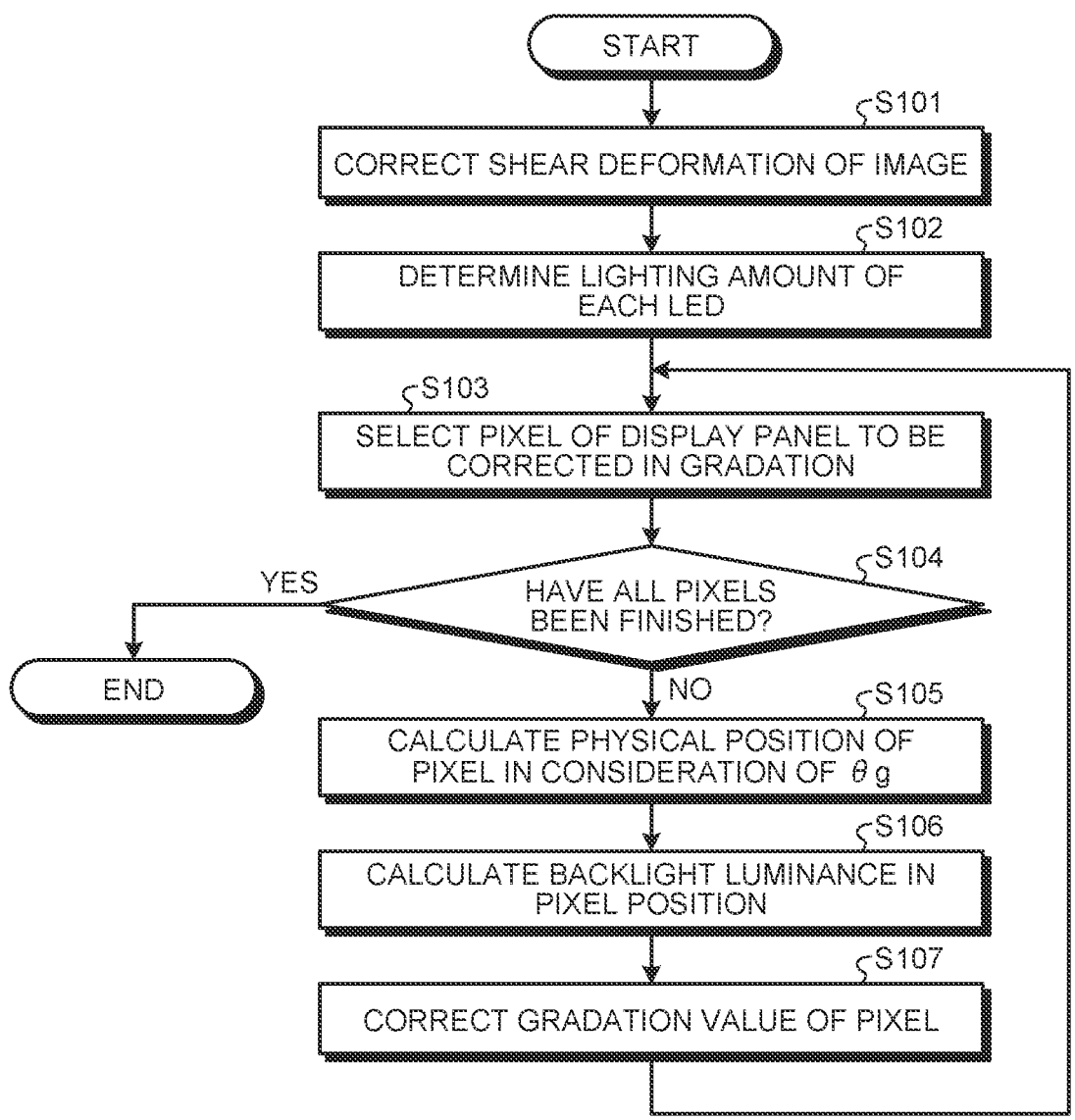
FIG. 24 is a flowchart for explaining processing of an image adjustment circuit according to the twelfth embodiment.

FIG. 22 is a block diagram illustrating an exemplary configuration of the display system according to the twelfth embodiment. FIG. 23 is a schematic diagram illustrating an exemplary backlight according to the twelfth embodiment. FIG. 24 is a flowchart for explaining processing of an image adjustment circuit according to the twelfth embodiment. As illustrated in FIG. 22, the display device 100 includes the two display panels 110, the sensor 120, the image separation circuit 150, an image adjustment circuit 170, and the interface 160. As illustrated in FIG. 8, the backlight IL is disposed on the back side of each of the two display panels 110. To facilitate the explanation, FIG. 22 illustrates the backlights IL. As illustrated in FIG. 22, the image adjustment circuit 170 includes an input image converter 171, a lighting amount calculator 172, a luminance distribution calculator 175, and a gradation value corrector 174.

The backlight IL is what is called a direct-type light source device. Light source control called "local dimming" is performed on the backlight IL, and the lighting amount is controlled for each partial light-emitting region PLA that serves as a portion of a light-emitting region 511.

Each of the two backlights IL includes the light-emitting region 511 and a light source control circuit 512. In the light-emitting region 511, the partial light-emitting regions PLA are arranged in a two-dimensional matrix (in a row-column configuration).

For example, the pixels Pix including 200 pixels in the vertical direction and 200 pixels in the horizontal direction overlap each of the partial light-emitting regions PLA of the twelfth embodiment. FIG. 22 schematically illustrates the arrangement of the partial light-emitting regions PLA, and the size of the partial light-emitting region PLA relative to the pixel Pix differs from the actual size in order to facilitate the explanation.

The backlight IL includes light-emitting element scan lines LGL extending in the Vx direction that select light-emitting elements, and light emission output signal lines LSL extending in the Vy direction orthogonal to the Vx direction. In the backlight IL, the light-emitting elements are arranged in regions surrounded by the light emission output signal lines LSL and the light-emitting element scan lines LGL.

One of the two backlights IL overlapping the display region 111 of one of the display panels 110 is for the right eye, and the other of the two backlights IL overlapping the display region 111 of the other of the display panels 110 is for the left eye. In the twelfth embodiment, a case will be described where the two backlights IL are included, one for the right eye and the other for the left eye. However, the present disclosure is not limited to the structure of using the two backlights IL as described above. For example, only one backlight IL may be used, in which the right-half region may overlap the display panel 110 and the left-half region may overlap the display panel 110 for the left eye, and the light-emitting region 511 of the one backlight IL may overlap the display regions 111 for the right eye and the left eye.

The image separation circuit 150 receives the image data for the left eye and the image data for the right eye transmitted from the control device 200 through the cable 300, and transmits the image data for the left eye to the image adjustment circuit 170 of the display panel 110 for displaying the image for the left eye, and transmits the image data for the right eye to the image adjustment circuit 170 of the display panel 110 for displaying the image for the right eye. A detailed configuration of the image adjustment circuit 170 will be described later.

In the twelfth embodiment, in the display region 111, the direction in which the scan lines GL extend is non-orthogonal to the direction in which the signal lines SL extend, in the same manner as in the fifth embodiment. Since the display panel 110 of the twelfth embodiment has the same configuration as that of the display panel of the fifth embodiment, detailed description thereof will not be given.

As illustrated in FIG. 23, a light-emitting element 516 is an inorganic light-emitting diode (LED) chip having a size of approximately from 3 μm to 300 μm in the plan view, and is called a micro-LED or a mini-LED. The light emission output signal lines LSL extend in the Vy direction, and are coupled to the cathodes of the light-emitting elements 516.

The light emission output signal lines LSL are arranged at intervals in the Vx direction. The light-emitting element scan lines LGL extend in the Vx direction, are arranged at intervals in the Vy direction, and are coupled to the anodes of the light-emitting elements 516.

Each of the light-emitting element scan lines LGL is coupled to the light-emitting elements 516 arranged along the extending direction of the light-emitting element scan line LGL. Each of the light emission output signal lines LSL is coupled to the light-emitting elements 516 arranged along the extending direction of the light emission output signal line LSL.

As illustrated in FIGS. 22 and 23, the light source control circuit 512 includes a light emission current control circuit 513, a switch array 514, and a timing control circuit 515. The light emission current control circuit 513 is electrically coupled to each of the light emission output signal lines LSL. The light emission current control circuit 513 supplies a current based on lighting amount data D1a to each of the light emission output signal lines LSL. The switch array 514 includes a plurality of switching elements Lsw (for example, field-effect transistors (FETs)) for selecting the respective light-emitting element scan lines LGL. When each of the switching elements Lsw is turned on, the light-emitting element scan line LGL coupled to the switching element Lsw is selected. The timing control circuit 515 controls the light emission current control circuit 513 and the switch array 514 based on a light source synchronization signal Dsync. The switch array 514 turns on/off the switching element Lsw based on a light-emitting element scan signal Dsw.

For example, in the twelfth embodiment, as illustrated in FIG. 23, each of the partial light-emitting regions PLA has one of the light-emitting element 516. Each of the partial light-emitting regions PLA may have a predetermined number of the light-emitting elements 516.

As described above, in FIG. 13, the direction Vsl is the direction in which the signal lines SL (refer to FIG. 5) extend. The direction Vsg orthogonal to the direction Vsl is parallel to the direction Vx. The direction Vss is the direction in which the scan lines GL (refer to FIG. 5) extend. The scan lines GL are inclined with respect to the direction Vx by the angle θg formed by the direction Vss and the direction Vsg. In contrast, the direction in which the light-emitting element scan lines LGL extend is parallel to the direction Vx. The scan lines GL are inclined with respect to the light-emitting element scan lines LGL by the angle θg formed by the direction in which the light-emitting element scan lines LGL extend and the direction in which the scan lines GL extend. The lighting amount needs to be calculated in consideration of this difference in inclination, and the brightness of the backlight at locations of the respective pixels needs to be calculated.

Therefore, in the twelfth embodiment, as illustrated in FIG. 24, the input image converter 171 converts image data subjected to shear deformation into a general quadrilateral image data format (Step S101). In this manner, the input image converter 171 is an image converter that converts the image data subjected to shear deformation into the general quadrilateral image data.

The image adjustment circuit 170 performs the image processing of local dimming after the processing at Step S101. The following describes the image processing of local dimming with reference to FIG. 24. After the processing at Step S101, the lighting amount calculator 172 determines the lighting amount of each LED (Step S102). After the processing at Step S102, the luminance distribution calculator 175 selects a pixel of the display panel to be corrected in gradation (Step S103). If no pixel is to be selected at Step S103 and all the pixels have been processed and finished (Yes at Step S104), the luminance distribution calculator 175 ends the image processing of local dimming. If any pixel to be selected remains at Step S103 and all the pixels have not been processed and finished (No at Step S104), the luminance distribution calculator 175 performs processing at Step S105. The luminance distribution calculator 175 calculates the physical position of the pixel of the display panel selected at Step S103 in consideration of the angle θg (Step S105). The luminance distribution calculator 175 calculates the luminance of the backlight in the physical pixel position of the pixel calculated at Step S105 (Step S106). The gradation value corrector 174 corrects the gradation of the pixel according to the luminance of the backlight calculated at Step S106 (Step S107). Then, the image adjustment circuit 170 performs the processing at Step S103 in order to process another pixel. In this manner, each of the pixels reflects the gradation value that has been subjected to the required correction in consideration of the angle θg.

As described above, the display device of the twelfth embodiment includes the display panel 110 having the display region 111, the backlight IL overlapping the display region 111, and the image adjustment circuit 170. The display panel 110 includes the array substrate SUB1, the pixels Pix provided in the display region 111 of the array substrate SUB1, the scan lines GL extending in the direction Vss, and the signal lines SL extending in the direction Vsl. The direction Vss is non-parallel and non-orthogonal to the direction orthogonal to the direction Vsl. The backlight IL includes the light-emitting elements 516 in positions overlapping the display region 111 in the plan view, and includes the light emission output signal lines LSL that extend in the direction Vsl (direction Vy) and are coupled to the light-emitting elements 516, and the light-emitting element scan lines LGL that extend in the direction Vx orthogonal to the direction Vsl (direction Vy) and are coupled to the light-emitting elements 516.

In addition, the image adjustment circuit 170 performs the effective local dimming control of the backlight IL to reduce the influence of the angle θg formed by the direction in which the light-emitting element scan lines LGL extend and the direction in which the scan lines GL extend, and to make the amount of light of the partial light-emitting region PLA to the pixel Pix appropriate.

Thirteenth Embodiment

Figure 25:
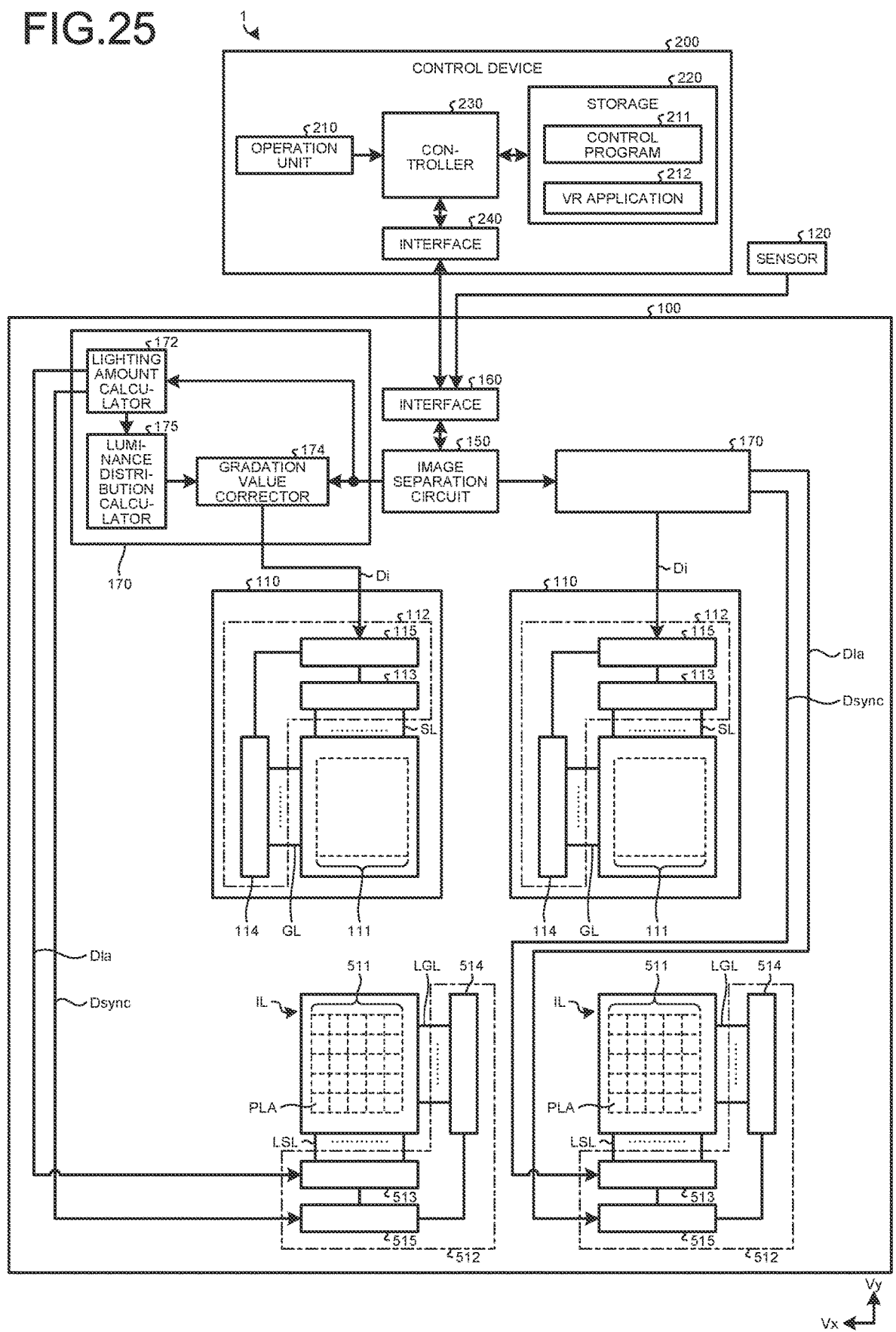
FIG. 25 is a block diagram illustrating an exemplary configuration of the display system according to a thirteenth embodiment.

In a thirteenth embodiment, an example of the backlight IL (refer to FIG. 8) will be described. FIG. 25 is a block diagram illustrating an exemplary configuration of the display system according to the thirteenth embodiment. Unlike the backlight IL of the twelfth embodiment (refer to FIG. 23), the backlight IL of the thirteenth embodiment (FIG. 25) includes the light-emitting element scan lines LGL extending in the Vss direction that select the light-emitting elements. In addition, the display system in the thirteenth embodiment illustrated in FIG. 25 differs from the display system of FIG. 22 in not including the input image converter 171. The same components as those in any of the embodiments described above are denoted by the same reference numerals, and will not be described again.

Figure 27:
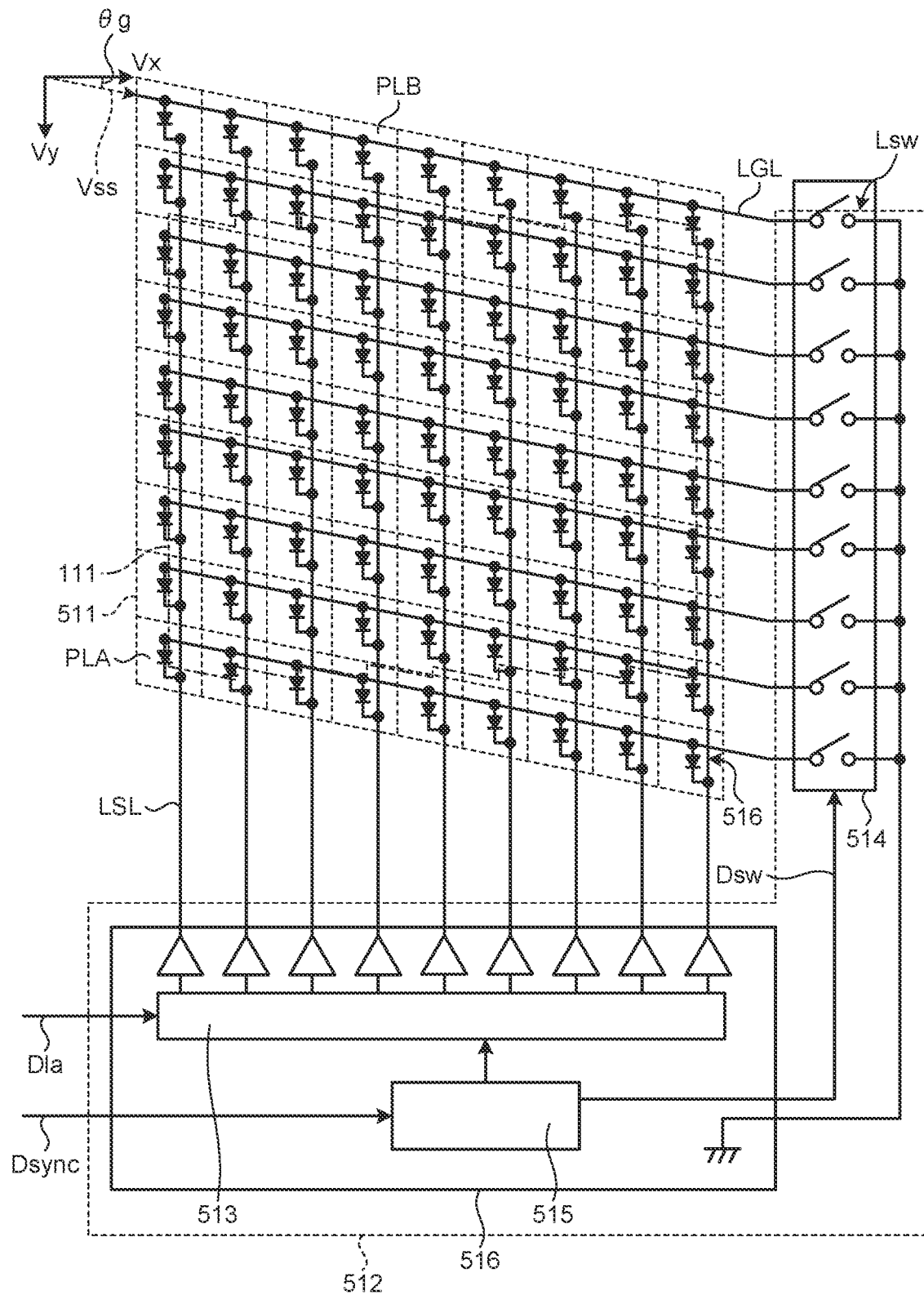
FIG. 27 is a schematic diagram illustrating an exemplary backlight according to the thirteenth embodiment.

As illustrated in FIG. 27, the backlight IL includes the light-emitting element scan lines LGL extending in the Vss direction that select the light-emitting elements, and the light emission output signal lines LSL extending in the Vy direction orthogonal to the Vx direction. The light-emitting element scan lines LGL extend in the Vss direction. In the backlight IL, the light-emitting elements 516 are arranged in the regions surrounded by the light emission output signal lines LSL and the light-emitting element scan lines LGL. As a result, each of the partial light-emitting regions PLA has a parallelogram shape.

The direction in which the light-emitting element scan lines LGL extend is parallel to the direction in which the scan lines GL extend. Therefore, the scan lines GL are not inclined with respect to the light-emitting element scan lines LGL. This configuration matches the amount of light emitted by the light-emitting elements 516 with the luminance of the pixels Pix in the actually overlapping display region 111.

The light-emitting element 516 located in a partial light-emitting region PLB of the light-emitting region 511 that does not overlap the display region 111 in the plan view may be removed to provide a dummy region that does not emit light. When the light-emitting element 516 is located in the partial light-emitting region PLB, load currents of each of the light emission output signal lines LSL and each of the light-emitting element scan lines LGL are uniform, so that the characteristics of the light-emitting element 516 vary with location by a smaller amount.

As described above, the display device of the thirteenth embodiment includes the display panel 110 having the display region 111 and the backlight IL overlapping the display region 111. The display panel 110 includes the array substrate SUB1, the pixels Pix provided in the display region 111 of the array substrate SUB1, the scan lines GL extending in the direction Vss, and the signal lines SL extending in the direction Vsl. The direction Vss is non-parallel and non-orthogonal to the direction orthogonal to the direction Vsl. The backlight IL includes the light-emitting elements 516 in the positions overlapping the display region 111 in the plan view, and includes the light emission output signal lines LSL that extend in the direction Vsl (direction Vy) and are coupled to the light-emitting elements 516, and the light-emitting element scan lines LGL that extend in the direction Vss and are coupled to the light-emitting elements 516. With this configuration, the direction in which the light-emitting element scan lines LGL extend is parallel to the direction in which the scan lines GL extend, so that the influence of the above-described angle θg decreases. As a result, the amount of light of the partial light-emitting region PLA to the pixel Pix is made appropriate, and the effective local dimming control is performed on the backlight IL.

The position of the pixel of the display panel can be easily calculated by also having the inclination of θg in the backlight IL. Accordingly, in the thirteenth embodiment, the input image converter 171 is not required as in the twelfth embodiment.

The display system of the thirteenth embodiment illustrated in FIG. 25 and the display system of the twelfth embodiment illustrated in FIG. 22 differ from each other in the configuration of the image adjustment circuit 170, and are the same as each other in configurations other than the configuration of the image adjustment circuit 170. However, optical profile data used in the calculation differs from the optical profile in general Cartesian coordinates. The optical profile is data that indicates how the brightness of a unit of light emission of the backlight spreads over the display surface as the brightness of the backlight, and is required to calculate the distribution of the brightness of the backlight. In the present embodiment, the light sources are obliquely arranged. Therefore, when the system of FIG. 25 is configured based on Cartesian coordinates, the optical profile needs to be corrected.

Figure 26A:
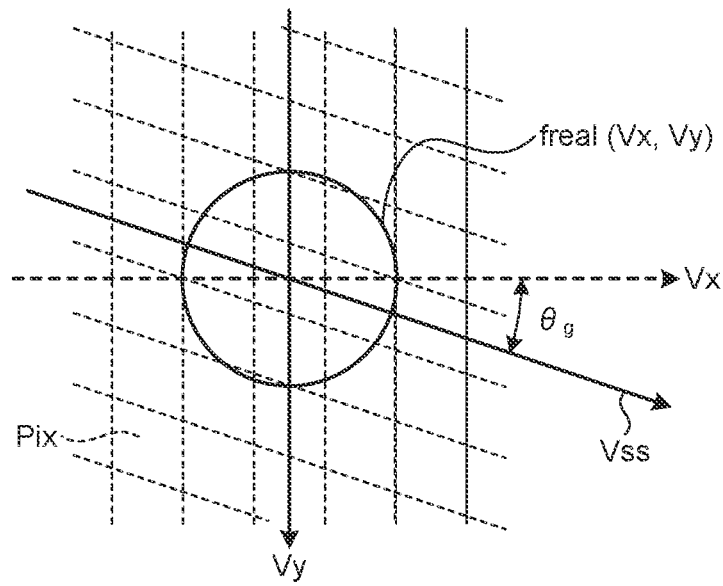
FIG. 26A is a schematic diagram illustrating optical profile data of the backlight before conversion for calculating a lighting amount of the backlight according to the thirteenth embodiment.
Figure 26B:
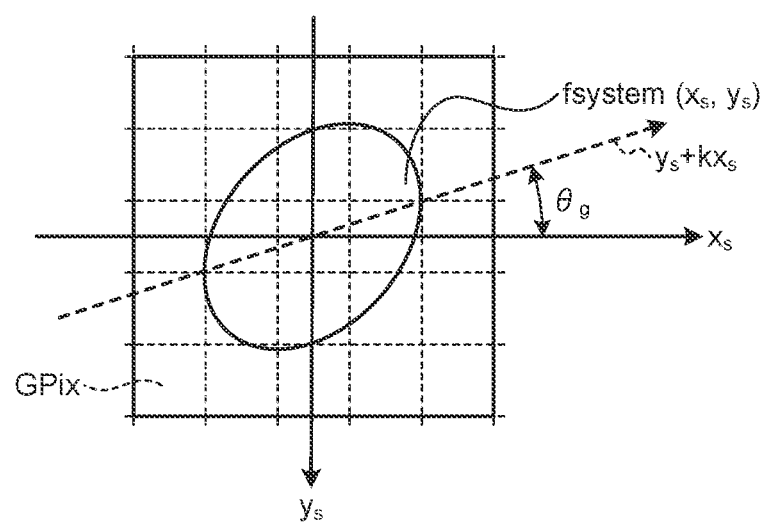
FIG. 26B is a schematic diagram illustrating optical profile data of the backlight after conversion for calculating the lighting amount of the backlight according to the thirteenth embodiment.

FIG. 26A is a schematic diagram illustrating the optical profile data of the backlight before conversion for calculating the lighting amount of the backlight according to the thirteenth embodiment. FIG. 26B is a schematic diagram illustrating the optical profile data of the backlight after conversion for calculating the lighting amount of the backlight according to the thirteenth embodiment. freal(Vx,Vy) illustrated in FIG. 26A denotes the optical profile indicating a propagation range of the light emission of one of the light-emitting elements 516 at certain coordinates (Vx,Vy) =(0,0). The scan lines GL extend in the direction Vss, and form the angle θg between the direction Vx and the direction Vss. Therefore, the pixel Pix is treated as having a parallelogram shape. When the parallelogram-shaped pixels Pix are converted into orthogonal grid-shaped pixels GPix treated by the image data, the optical profile freal(Vx,Vy) is converted into an optical profile fsytem(Xs,Ys) in the Cartesian coordinate system where a direction Xs is orthogonal to a direction Ys (refer to FIG. 26B).

In the display system of the thirteenth embodiment, Expression (1) and Expression (2) below are used to convert the coordinates of the image data into Cartesian coordinates where the pixels Pix are orthogonal grid-shaped pixels and the direction Xs and the direction Ys are at right angles. An inclination k is obtained by Expression (3). Expressions (1) to (3) are stored in advance as a converted optical profile in the image adjustment circuit 170.

$$x = x_s \quad (1)$$

$$y = y_s + kx_s \quad (2)$$

$$k = \tan \theta_g \quad (3)$$

As illustrated in FIG. 26B, the image data is represented by the coordinates of the orthogonal grid. Therefore, even if the calculation is performed on the image data subjected to shear deformation assuming that the image data is in the Cartesian coordinate system, the lighting amount calculator 172 can calculate the correct luminance by calculating the lighting amount using the optical profile fsytem(Xs,Ys). The lighting amount calculator 172 transmits the calculated lighting amount data D1a and the light source synchronization signal Dsync to the light source control circuit 512.

The luminance distribution calculator 175 calculates the luminance distribution for each of the pixels Pix that overlaps the lighting amount of one of the partial light-emitting regions PLA calculated using the optical profile fsytem(Xs, Ys). The gradation value corrector 174 corrects the gradation value of each of the pixels Pix in the image data based on the luminance distribution calculated by the luminance distribution calculator 175, and transmits the corrected image data Di including the corrected gradation value to the display control circuit 112.

As explained above, the image adjustment circuit 170 calculates the lighting amount of each of the light-emitting elements 516 by converting the coordinates of the image with respect to the direction Vsl (direction Vy) serving as a first axis and the direction Vss serving as a second axis into the coordinates of the image with respect to the direction Vsl (direction Vy) serving as the first axis and the direction Vx orthogonal to the direction Vsl (direction Vy) serving as the second axis. This processing reduces the effect of the angle θg formed between the direction in which the light-emitting element scan lines LGL extend and the direction in which the scan lines GL extend. As a result, the amount of light of the partial light-emitting region PLA to the pixel Pix is made appropriate, and the effective local dimming control is performed on the backlight IL.

While the preferred embodiments have been described above, the present disclosure is not limited to such embodiments. The content disclosed in the embodiments is merely an example, and can be variously modified within the scope not departing from the gist of the present disclosure. Any modifications appropriately made within the scope not departing from the gist of the present disclosure also naturally belong to the technical scope of the present disclosure.

What is claimed is:

1. A display device having a display region to be viewed through a lens, the display device comprising:
   a substrate; and
   the display region in which the substrate is provided with a plurality of pixels, a plurality of scan lines extending in a first direction, and a plurality of signal lines extending in a second direction, wherein
   the first direction is non-parallel and non-orthogonal to a direction orthogonal to the second direction,
   each of the pixels comprises a first pixel to display a first color, a second pixel to display a second color that is different from the first color, and a third pixel to display a third color that is different from the first color and the second color,
   each of the first pixel, the second pixel, and the third pixel has a first side and a second side along the second direction,
   in the second direction,
      the first pixel is disposed adjacent to the second pixel and the third pixel,
      the second pixel is disposed adjacent to the first pixel and the third pixel, and
      the third pixel is disposed adjacent to the second pixel and the first pixel,
   the first pixels are arranged in a third direction intersecting both the first direction and the second direction, the third direction being non-parallel and non-orthogonal to the first direction and being non-parallel and non-orthogonal to the second direction,
   the second pixels are arranged in the third direction,
   the third pixels are arranged in the third direction, and
   in a fourth direction perpendicular to the second direction,
      the first pixel is disposed such that the first side of the first pixel faces part of the second side of the second pixel and part of the second side of the third pixel,
      the second pixel is disposed such that the first side of the second pixel faces part of the second side of the third pixel and part of the second side of the first pixel, and
      the third pixel is disposed such that the first side of the third pixel faces part of the second side of the first pixel and part of the second side of the second pixel.

2. The display device according to claim 1, further comprising:
   a peripheral region located between ends of the substrate and the display region;
   at least one scan line drive circuit that is disposed in the peripheral region and is coupled to the scan lines;
   a signal line coupling circuit that is disposed in the peripheral region and is coupled to the signal lines;
   a driver integrated circuit (IC) that is disposed in the peripheral region and is configured to control the scan line drive circuit and the signal line coupling circuit; and
   terminals that are provided to the substrate and couple the driver IC to the substrate, wherein
   the terminals are arranged in a direction parallel to the direction orthogonal to the second direction.

3. The display device according to claim 1, wherein
   the first direction is a direction connecting together first reference positions in the first pixels coupled to one of the scan lines, and
   the second direction is a direction connecting together second reference positions in the first pixels coupled to one of the signal lines.

4. The display device according to claim 1, comprising at least one scan line drive circuit that is disposed in a peripheral region located between ends of the substrate and the display region and is coupled to the scan lines, wherein the scan line drive circuit comprises a bent portion.

5. The display device according to claim 1, wherein the first direction forms an angle of from 10.49 degrees to 33.07 degrees with respect to the direction orthogonal to the second direction.

6. The display device according to claim 1, wherein the display region has a circular outer shape.

7. The display device according to claim 1, wherein the display region has a polygonal outer shape.

8. The display device according to claim 1, wherein
   a scan line drive circuit that is disposed in a peripheral region located between ends of the substrate and the display region and is coupled to the scan lines comprises a first scan line drive circuit and a second scan line drive circuit that is disposed in the peripheral region on an opposite side of the first scan line drive circuit with the display region interposed between the first scan line drive circuit and the second scan line drive circuit, and
   the scan lines coupled to the first scan line drive circuit and the scan lines coupled to the second scan line drive circuit are alternately arranged at predetermined intervals in the second direction.

9. The display device according to claim 1, further comprising a backlight in which a plurality of light-emitting elements are arranged in positions overlapping the display region in a plan view, wherein
   the backlight comprises:
      light emission output signal lines that extend in the second direction and are coupled to the light-emitting elements; and
      light-emitting element scan lines that extend in the direction orthogonal to the second direction and are coupled to the light-emitting elements.

10. The display device according to claim 1, further comprising a backlight in which a plurality of light-emitting elements are arranged in positions overlapping the display region in a plan view, wherein
    the backlight comprises:
       light-emitting element scan lines that extend in the first direction and are coupled to the light-emitting elements; and
       light emission output signal lines that extend in the second direction and are coupled to the light-emitting elements.

11. The display device according to claim 1, wherein
    the substrate has a side having a straight line, and
    the side of the substrate is orthogonal to the second direction in which the signal lines extend.

12. The display device according to claim 1, wherein
each of the first pixels has two diagonal lines including a first diagonal line, and the first diagonal lines of the first pixels are along the third direction;
each of the second pixels has two diagonal lines including a first diagonal line, the first diagonal lines of the second pixels are along the third direction; and
each of the third pixels has two diagonal lines including a first diagonal line, and the first diagonal lines of the third pixels are along the third direction.

13. The display device according to claim 1, wherein
θg is an angle formed by the first direction that is a direction of extension of the scan lines, and the fourth direction orthogonal to the second direction that is a direction of extension of the signal lines,
a pixel width is a distance of each of the pixels in the fourth direction,
a first distance is equal to the pixel width×tan (θg), and
the first pixel and the second pixel adjacent to the first pixel are arranged so as to be offset from each other by the first distance in the second direction.

14. A display device comprising:
a substrate; and
a display region in which the substrate is provided with a plurality of pixels, a plurality of scan lines extending in a first direction, and a plurality of signal lines extending in a second direction, wherein
the first direction is non-parallel and non-orthogonal to a direction orthogonal to the second direction,
each of the pixels comprises a first pixel to display a first color, a second pixel to display a second color that is different from the first color, and a third pixel to display a third color that is different from the first color and the second color,
each of the first pixel, the second pixel, and the third pixel has a first side and a second side along the second direction,
wherein, in the second direction,
  the first pixel is disposed adjacent to the second pixel and the third pixel,
  the second pixel is disposed adjacent to the first pixel and the third pixel, and
  the third pixel is disposed adjacent to the second pixel and the first pixel,
the first pixels are arranged in a third direction intersecting both the first direction and the second direction, the third direction being non-parallel and non-orthogonal to the first direction and being non-parallel and non-orthogonal to the second direction,
the second pixels are arranged in the third direction,
the third pixels are arranged in the third direction, and
in a fourth direction perpendicular to the second direction,
  the first pixel is disposed such that the first side of the first pixel faces part of the second side of the second pixel and part of the second side of the third pixel,
  the second pixel is disposed such that the first side of the second pixel faces part of the second side of the third pixel and part of the second side of the first pixel, and
  the third pixel is disposed such that the first side of the third pixel faces part of the second side of the first pixel and part of the second side of the second pixel.

15. A display system comprising:
a lens;
a display device having a display region to be viewed through the lens; and
a control device configured to output an image to the display device, and comprising:
a substrate; and
the display region in which the substrate is provided with a plurality of pixels, a plurality of scan lines extending in a first direction, and a plurality of signal lines extending in a second direction, wherein
the first direction is non-parallel and non-orthogonal to a direction orthogonal to the second direction,
each of the pixels comprises a first pixel to display a first color, a second pixel to display a second color that is different from the first color, and a third pixel to display a third color that is different from the first color and the second color,
each of the first pixel, the second pixel, and the third pixel has a first side and a second side along the second direction,
in the second direction,
  the first pixel is disposed adjacent to the second pixel and the third pixel,
  the second pixel is disposed adjacent to the first pixel and the third pixel, and
  the third pixel is disposed adjacent to the second pixel and the first pixel,
the first pixels are arranged in a third direction intersecting both the first direction and the second direction, the third direction being non-parallel and non-orthogonal to the first direction and being non-parallel and non-orthogonal to the second direction,
the second pixels are arranged in the third direction,
the third pixels are arranged in the third direction, and
in a fourth direction perpendicular to the second direction,
  the first pixel is disposed such that the first side of the first pixel faces part of the second side of the second pixel and part of the second side of the third pixel,
  the second pixel is disposed such that the first side of the second pixel faces part of the second side of the third pixel and part of the second side of the first pixel, and
  the third pixel is disposed such that the first side of the third pixel faces part of the second side of the first pixel and part of the second side of the second pixel.

16. The display system according to claim 15, wherein the first direction forms an angle of from 10.49 degrees to 33.07 degrees with respect to the direction orthogonal to the second direction.

17. The display system according to claim 15, wherein the first direction forms an angle of from 7.45 degrees to 49.72 degrees with respect to the direction orthogonal to the second direction.

18. The display system according to claim 15, wherein the control device is configured to perform compensation processing to compensate for distortion that deforms the image due to an influence of the angle formed by the first direction in which the scan lines extend with respect to the direction orthogonal to the second direction.

19. The display system according to claim 15, wherein
the display device comprises a display control circuit configured to control display in the display region, and
the display control circuit is configured to perform compensation processing to compensate for distortion that deforms the image received from the control device due to an influence of the angle formed by the first direction in which the scan lines extend with respect to the direction orthogonal to the second direction.

20. The display system according to claim 15, wherein
the display device comprises a backlight in which a plurality of light-emitting elements are arranged in positions overlapping the display region in a plan view, and
the backlight comprises:
  light-emitting element scan lines that extend in the first direction and are coupled to the light-emitting elements; and
  light emission output signal lines that are coupled to the light-emitting elements and extend in the second direction.

\* \* \* \* \*